(12) United States Patent
Lee et al.

(10) Patent No.: US 12,068,251 B2
(45) Date of Patent: Aug. 20, 2024

(54) SEMICONDUCTOR DEVICE, LAYOUT DESIGN METHOD FOR THE SAME AND METHOD FOR FABRICATING THE SAME

(71) Applicant: Samsung Electronics Co., Ltd., Suwon-si (KR)

(72) Inventors: Byung Hyun Lee, Suwon-si (KR); Sung-Ok Lee, Hwaseong-si (KR); Sang Do Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 399 days.

(21) Appl. No.: 17/449,721

(22) Filed: Oct. 1, 2021

(65) Prior Publication Data
US 2022/0223523 A1     Jul. 14, 2022

(30) Foreign Application Priority Data
Jan. 11, 2021   (KR) ................. 10-2021-0003018

(51) Int. Cl.
*H01L 23/528*   (2006.01)
*H01L 23/48*    (2006.01)
*H01L 27/092*   (2006.01)

(52) U.S. Cl.
CPC ........ *H01L 23/5286* (2013.01); *H01L 23/481* (2013.01); *H01L 27/092* (2013.01); *H01L 27/0924* (2013.01)

(58) Field of Classification Search
CPC ............. H01L 23/5286; H01L 23/481; H01L 27/092; H01L 27/0924; H01L 23/485; H01L 23/5221; H01L 21/823871; H01L 29/42392; H01L 29/78696; H01L 23/5283; H01L 23/5226; H01L 27/0207; H01L 21/823431; H01L 21/823475; H01L 27/0886
See application file for complete search history.

(56) References Cited

U.S. PATENT DOCUMENTS 6,355,950 B1    3/2002   Livengood et al.
8,338,939 B2    12/2012  Lin et al.
(Continued)

*Primary Examiner* — Karen Kusumakar
*Assistant Examiner* — Adam S Bowen
(74) *Attorney, Agent, or Firm* — Myers Bigel, P.A.

(57) ABSTRACT

A semiconductor device, a layout design method for the semiconductor device, and a method for fabricating the semiconductor device are provided. The semiconductor device includes a standard cell region. The semiconductor device includes a substrate including a first surface and a second surface, which are opposite to each other, a first power wiring, which extends in a first direction on the first surface of the substrate, and is configured to provide a first power voltage to the standard cell region, a second power wiring, which extends in the first direction on the first surface of the substrate, is arranged alternately with the first power wiring in a second direction intersecting the first direction, and is configured to provide a second power voltage different from the first power voltage to the standard cell region, a first back routing wiring on the second surface of the substrate, and a plurality of first tab cell regions arranged along the second direction, wherein each of the first tab cell regions includes a first through via, which penetrates the substrate and connects the first power wiring and the first back routing wiring.

17 Claims, 19 Drawing Sheets

(56) References Cited

U.S. PATENT DOCUMENTS

| | | | |
|---|---|---|---|
| 8,350,389 B2 | 1/2013 | Itaya et al. | |
| 8,507,957 B2 | 8/2013 | Hou et al. | |
| 8,694,925 B1 | 4/2014 | Beust et al. | |
| 8,694,945 B2 | 4/2014 | Wang et al. | |
| 9,455,187 B1 | 9/2016 | Gambino et al. | |
| 9,601,411 B2 | 3/2017 | Kalnitsky et al. | |
| 9,837,453 B1 | 12/2017 | Leobandung | |
| 10,622,307 B2 | 4/2020 | Kim | |
| 10,636,739 B2 | 4/2020 | Beyne et al. | |
| 2019/0164882 A1* | 5/2019 | Chen | H01L 23/535 |
| 2020/0042668 A1 | 2/2020 | Peng et al. | |
| 2020/0082045 A1 | 3/2020 | Lee | |
| 2020/0105671 A1 | 4/2020 | Lai et al. | |
| 2020/0134121 A1 | 4/2020 | Lin et al. | |
| 2021/0358901 A1* | 11/2021 | Liu | G06F 30/392 |

\* cited by examiner

SEMICONDUCTOR DEVICE, LAYOUT DESIGN METHOD FOR THE SAME AND METHOD FOR FABRICATING THE SAME

This application claims priority to Korean Patent Application No. 10-2021-0003018, filed on Jan. 11, 2021, and all the benefits accruing therefrom under 35 U.S.C. § 119, the disclosure of which is incorporated herein by reference in its entirety.

BACKGROUND

1. Technical Field

Embodiments of the present inventive concept relate to a semiconductor device, a layout design method for the semiconductor device, and a method for fabricating the semiconductor device.

2. Description of the Related Art

Semiconductor devices are in the limelight as an important factor in the electronic industry due to characteristics such as miniaturization, multi-functionality and/or low fabricating cost. The semiconductor devices may be classified into a semiconductor storage device that stores logical data, a semiconductor logical device that performs a computing process on logical data, a hybrid semiconductor device that includes storage elements and logical elements, and the like.

As the electronic industry continues to develop, there is an increasing demand for semiconductor devices. For example, there are increasing demands for semiconductor devices with characteristics, such as high reliability, high speed, and/or multi-functionality. To satisfy such characteristics, the structures inside the semiconductor device may be increasingly complicated and highly integrated.

SUMMARY

Embodiments of the present inventive concept may provide a semiconductor device in which a PPA (Power, Performance, and Area) is improved.

Embodiments of the present inventive concept may also provide a layout design method for a semiconductor device in which PPA is improved.

Embodiments of the present inventive concept may also provide a method for fabricating a semiconductor device in which PPA is improved.

Embodiments of the present inventive concept are not restricted to the ones set forth hereafter. The above and other embodiments of the present inventive concept will become more apparent to one of ordinary skill in the art to which the present inventive concept pertains by referencing the detailed description of embodiments of the present inventive concept given below.

According to an aspect of the present inventive concept, there is provided a semiconductor device including a standard cell region, the semiconductor device comprising a substrate including a first surface and a second surface, which are opposite to each other, a first power wiring, which extends in a first direction on the first surface of the substrate, and is configured to provide a first power voltage to the standard cell region, a second power wiring, which extends in the first direction on the first surface of the substrate, is arranged alternately with the first power wiring in a second direction intersecting the first direction, and is configured to provide a second power voltage different from the first power voltage to the standard cell region, a first back routing wiring on the second surface of the substrate, and a plurality of first tab cell regions arranged along the second direction, wherein each of the first tab cell regions includes a first through via, which penetrates the substrate and connects the first power wiring and the first back routing wiring.

According to an aspect of the present inventive concept, there is provided a semiconductor device comprising a substrate including a first surface and a second surface, which are opposite to each other, a first active pattern extending in a first direction on the first surface of the substrate, a gate electrode extending in a second direction, intersecting the first direction, on the first active pattern, a first source/drain contact connected to a first source/drain region of the first active pattern, a first power wiring extending in the first direction and connected to the first source/drain contact on the first surface of the substrate, a first back routing wiring on the second surface of the substrate, and a first through via, which penetrates the substrate and connects the first power wiring and the first back routing wiring.

According to an aspect of the present inventive concept, there is provided a semiconductor device including a standard cell region, the semiconductor device comprising a substrate including a first surface and a second surface, which are opposite to each other, a first power wiring, which extends in a first direction on the first surface of the substrate, and is configured to provide a first power voltage to the standard cell region, a second power wiring, which extends alongside the first power wiring on the first surface of the substrate, and is configured to provide the standard cell region with a second power voltage different from the first power voltage, a first back routing wiring placed at a first back routing level on the second surface of the substrate, a second back routing wiring, which is placed at a second back routing level that is spaced apart from the second surface of the substrate farther than the first back routing level and intersects the first back routing wiring, a first through via, which penetrates the substrate and connects the first power wiring and the first back routing wiring, and a second through via, which penetrates the substrate and connects the second power wiring and the first back routing wiring.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Hereinafter, a semiconductor device according to example embodiments will be described referring to FIGS. 1 to 17.

Figure 1:
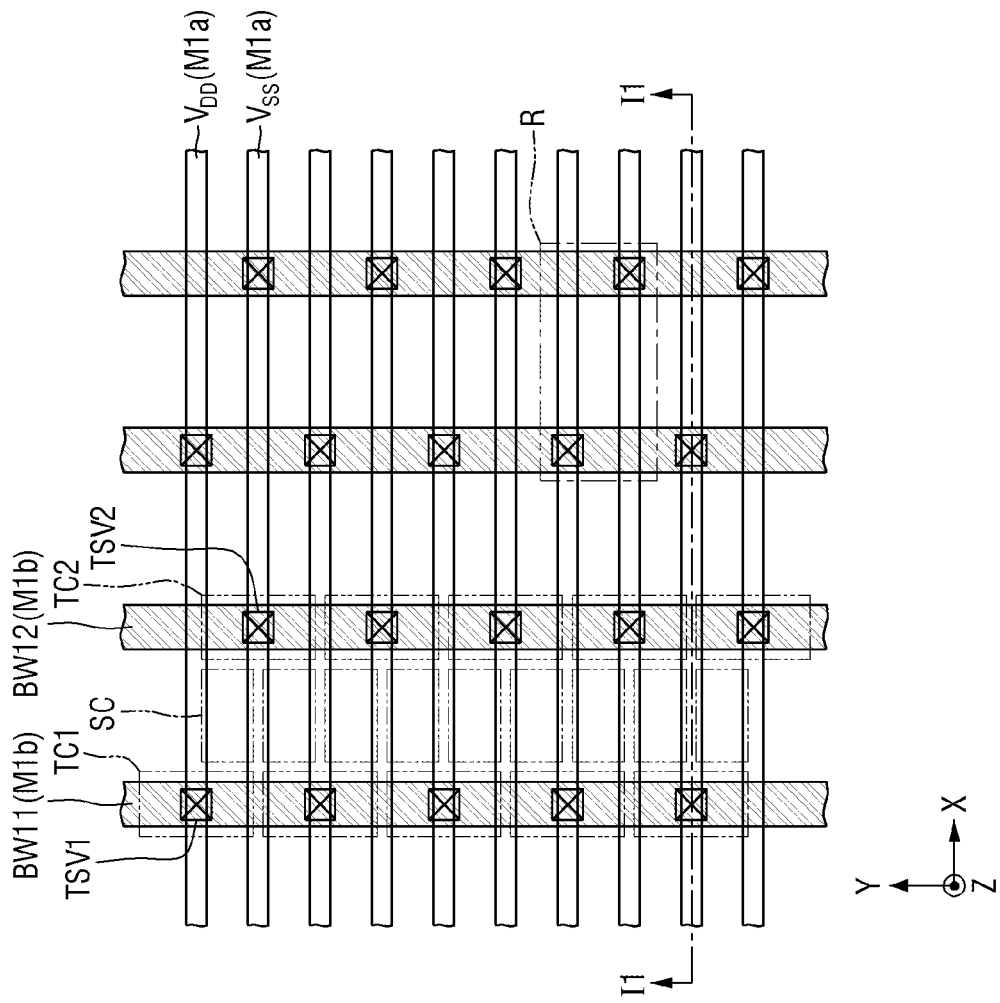
FIG. 1 is a schematic layout diagram that illustrates a semiconductor device according to some embodiments of the inventive concept.
Figure 2:
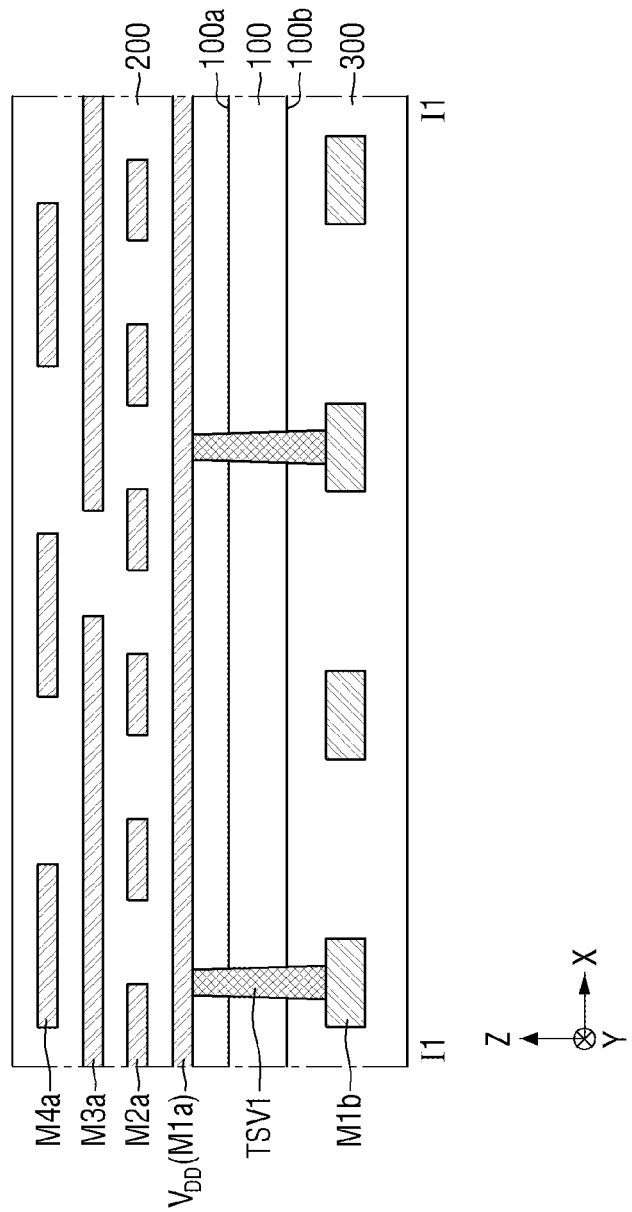
FIG. 2 is a schematic cross-sectional view taken along I1-I1 of FIG. 1.

FIG. 1 is a schematic layout diagram that illustrates a semiconductor device according to some embodiments of the inventive concept. FIG. 2 is a schematic cross-sectional view taken along I1-I1 of FIG. 1.

Referring to FIGS. 1 and 2, semiconductor devices according to some embodiments include a standard cell region SC, a substrate 100, first to fourth front routing wirings M1a, M2a, M3a, and M4a, a first back routing wiring M1b, a first tab cell region TC1, and a second tab cell region TC2.

The cells described herein may be expressions of various logic elements provided in an operation of designing the layout of the semiconductor device, an operation of fabricating the semiconductor device, and/or an operation of testing the semiconductor device. That is, the cells may be provided from a cell library of a layout design tool. Alternatively or additionally, the cells may be provided by a producer in the semiconductor fabricating process.

Standard cells provided by the cell library may be provided inside the standard cell region SC. The standard cell may mean any one of various cells for implementing logic circuits. For example, the standard cell may represent one or more of a variety of types of logic elements, such as AND gates, NAND gates, OR gates, NOR gates, XOR gates, and inverters.

The substrate 100 may be bulk silicon or SOI (silicon-on-insulator). In contrast, the substrate 100 may be a silicon substrate or may include other materials, including, but not limited to, for example, silicon germanium, SGOI (silicon germanium on insulator), indium antimonide, lead tellurium compounds, indium arsenic, indium phosphide, gallium arsenide and/or gallium antimonide.

The substrate 100 may include a first surface 100a and a second surface 100b that are opposite to each other. In embodiments described below, the first surface 100a may be referred to as a front side of the substrate 100, and the second surface 100b may be referred to as a back side of the substrate 100. In some embodiments, the logic circuit of the standard cell region SC may be implemented on the first surface 100a of the substrate 100.

The first to fourth front routing wirings M1a, M2a, M3a and M4a may be placed on the first surface 100a of the substrate 100. For example, a front interlayer insulating film 200 that is on and at least partially covers the first surface 100a of the substrate 100 may be formed. The first to fourth front routing wirings M1a, M2a, M3a and M4a may be formed inside the front interlayer insulating film 200. The first to fourth front routing wirings M1a, M2a, M3a and M4a may be sequentially stacked on the first surface 100a of the substrate 100. In FIG. 2, the number and placement of the first to fourth front routing wirings M1a, M2a, M3a and M4a are only an example, and embodiments of the inventive concept are not limited thereto. Further, although FIG. 2 only shows that four routing wirings (e.g., M1a, M2a, M3a and M4a) are formed on the first surface 100a of the substrate 100, this is only for convenience of explanation, and routing wirings of five layers or more may be formed in other embodiments.

The first to fourth front routing wirings M1a, M2a, M3a and M4a may include a first power wiring $V_{DD}$ and a second power wiring $V_{SS}$. The first power wiring $V_{DD}$ and the second power wiring $V_{SS}$ may be spaced apart from each other and extend side by side. For example, the first power wiring $V_{DD}$ and the second power wiring $V_{SS}$ may each extend in a first direction X parallel to an upper side of the substrate 100. The first power wiring $V_{DD}$ and the second power wiring $V_{SS}$ may be arranged along a second direction Y parallel to the upper side of the substrate 100 and intersecting the first direction X. In some embodiments, the first power wiring $V_{DD}$ and the second power wiring $V_{SS}$ may be arranged alternately in the second direction Y.

The first power wiring $V_{DD}$ may provide a first power voltage to the standard cell region SC. The second power wiring $V_{SS}$ may provide a second power voltage different from the first power voltage to the standard cell region SC. For example, the first power wiring $V_{DD}$ may provide a drain voltage to the standard cell region SC, and the second power wiring $V_{SS}$ may provide a source voltage to the standard cell region SC. As an example, the first power voltage may be a positive (+) voltage, and the second power voltage may be a ground GND voltage or a negative (−) voltage.

In some embodiments, the first power wiring $V_{DD}$ and the second power wiring $V_{SS}$ may be placed at the lowermost part of the first to fourth front routing wirings M1a, M2a, M3a and M4a. For example, a first front routing wiring M1a may include a first power wiring $V_{DD}$ and a second power wiring $V_{SS}$.

A first back routing wiring M1b may be placed on the second surface 100b of the substrate 100. For example, a back interlayer insulating film 300 that is on and at least partially covers the second surface 100b of the substrate 100 may be formed. The first back routing wiring M1b may be formed inside the back interlayer insulating film 300. In FIG. 2, the number, placement, and the like of the first back routing wiring M1b are only examples, and embodiments of the inventive concept are not limited thereto. Further, although FIG. 2 shows that only the routing wiring of one layer (e.g., M1b) is formed on the second surface 100b of the substrate 100, this is only for convenience of explanation, and routing wirings of two layers or more may be formed in other embodiments.

The first back routing wiring M1b may form a power delivery network (PDN) of a semiconductor device according to some embodiments. For example, the first back routing wiring M1b is connected to a pad or the like of the semiconductor device according to some embodiments, and is supplied with power from outside of the semiconductor device and may transfer the power to elements within the semiconductor device.

In some embodiments, the first back routing wiring M1b may intersect the first power wiring $V_{DD}$ and the second power wiring $V_{SS}$. For example, the first back routing wiring M1b may extend in the second direction Y.

In some embodiments, the first back routing wiring M1b may include a first back wiring pattern BW11 and a second back wiring pattern BW12. The first back wiring pattern BW11 and the second back wiring pattern BW12 may be spaced apart from each other and extend side by side. For example, the first back wiring pattern BW11 and second back wiring pattern BW12 may each extend in the second direction Y. The first back wiring pattern BW11 and the second back wiring pattern BW12 may be arranged along the first direction X. In some embodiments, the first back wiring pattern BW11 and the second back wiring pattern BW12 may be arranged alternately in the first direction X.

A first tab cell region TC1 may include a first through via TSV1. The first through via TSV1 may penetrate the substrate 100 to connect the first power wiring $V_{DD}$ and the first back routing wiring M1b. As an example, the first through via TSV1 extends in a third direction Z, which intersects the upper side of the substrate 100, and may connect the first power wiring $V_{DD}$ and the first back wiring pattern BW11. As a result, the first back routing wiring M1b, which forms the power delivery network PDN, may supply the first power voltage to the standard cell region SC.

In some embodiments, a plurality of first tab cell regions TC1 may be arranged along the second direction Y. For example, as shown in FIG. 1, the first tab cell region TC1 may be placed to correspond to a plurality of first power wirings $V_{DD}$ arranged along the second direction Y. As a result, the plurality of first through vias TSV1 may connect the respective first power wirings $V_{DD}$ and the first back wiring pattern BW11.

In some embodiments, the width of the first through via TSV1 may decrease from the first back routing wiring M1b toward the first power wiring $V_{DD}$. This may be due to the characteristics of the etching process for forming the first through via TSV1. For example, the first through via TSV1 may be formed from an etching process performed on the second surface 100b of the substrate 100.

The second tab cell region TC2 may include a second through via TSV2. The second through via TSV2 may penetrate the substrate 100 to connect the second power wiring $V_{SS}$ and the first back routing wiring M1b. As an example, the second through via TSV2 may extend in the third direction Z to connect the second power wiring $V_{SS}$ and the second back wiring pattern BW12. As a result, the first back routing wiring M1b that forms the power delivery network PDN may supply the second power voltage to the standard cell region SC.

In some embodiments, the plurality of second tab cell regions TC2 may be arranged along the second direction Y. For example, as shown in FIG. 1, the second tab cell region TC2 may be placed to correspond to a plurality of second power wirings $V_{SS}$ arranged along the second direction Y. As a result, the plurality of second through vias TSV2 may connect the respective second power wirings $V_{SS}$ and the second back wiring pattern BW12.

In some embodiments, the width of the second through via TSV2 may decrease from the first back routing wiring M1b toward the second power wiring $V_{SS}$. This may be due to the characteristics of the etching process for forming the second through via TSV2. For example, the second through via TSV2 may be formed from an etching process performed on the second surface 100b of the substrate 100.

The first tab cell region TC1 and the second tab cell region TC2 may be placed to be spaced apart from each other. In some embodiments, the first tab cell regions TC1 may be arranged to intersect the second tab cell regions TC2 (e.g., in a zigzag form). For example, the plurality of second tab cell regions TC2 arranged along the second direction Y may be placed to be spaced apart in the first direction X from the plurality of first tab cell regions TC1, which are arranged along the second direction Y.

In some embodiments, the standard cell region SC may be interposed between the first tab cell region TC1 and the second tab cell region TC2. For example, as shown in FIG. 1, the first tab cell region TC1, the standard cell region SC, and the second tab cell region TC2 may be arranged sequentially along the first direction X. Although only one standard cell region SC is shown as being interposed between the first tab cell region TC1 and the second tab cell region TC2, this is only an example, and two or more standard cell regions SC may be interposed between the first tab cell region TC1 and the second tab cell region TC2. Also, not only the standard cell region SC, but also a filler cell (or a dummy cell) region which at least partially fills an empty space between the standard cell regions SC may be placed between the first tab cell region TC1 and the second tab cell region TC2.

Figure 3:
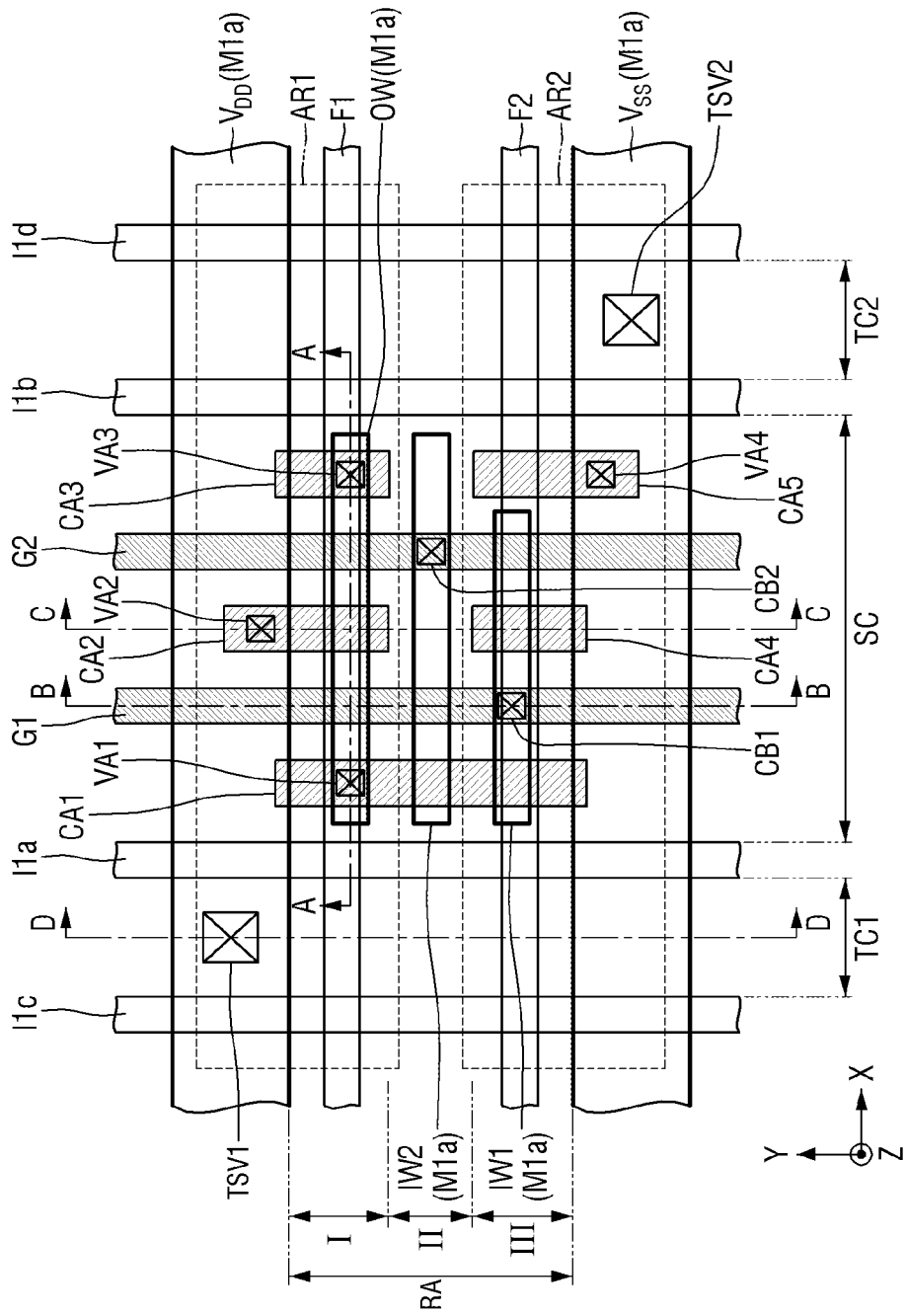
FIG. 3 is a layout diagram for explaining a region R of FIG. 1.
Figure 4:
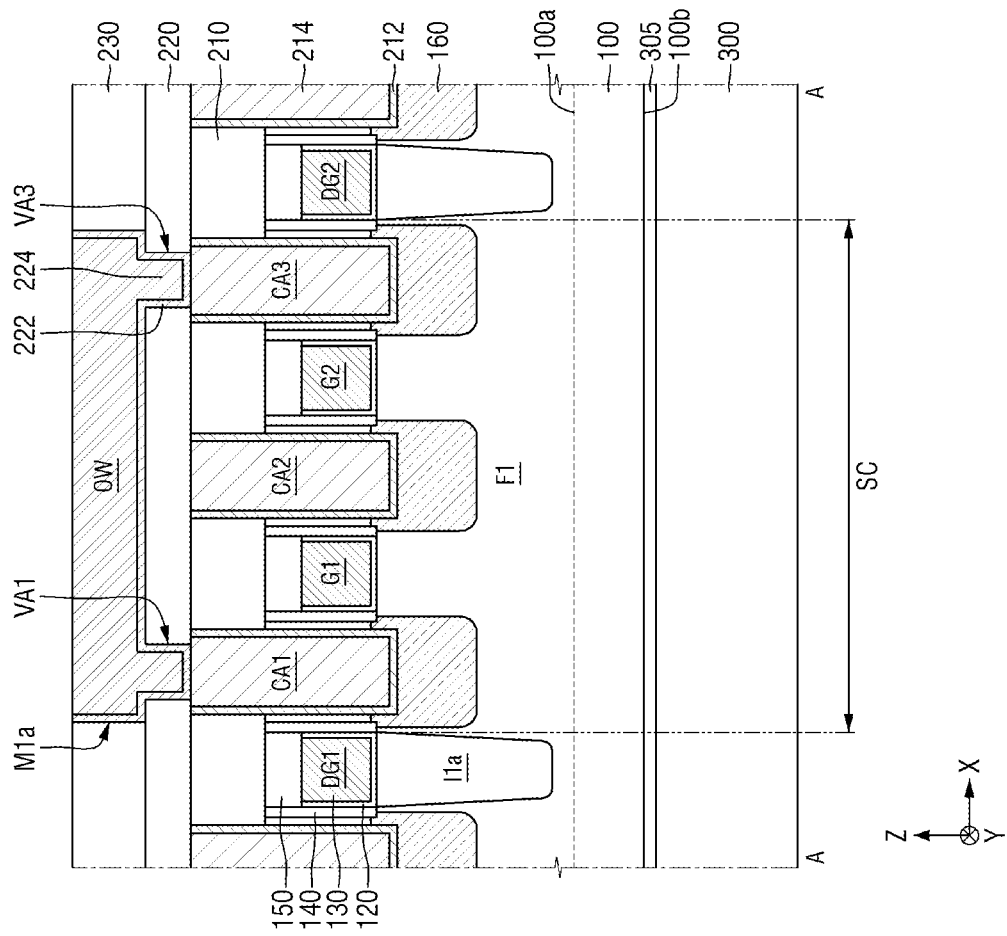
FIG. 4 is a cross-sectional view taken along A-A of FIG. 3.
Figure 5:
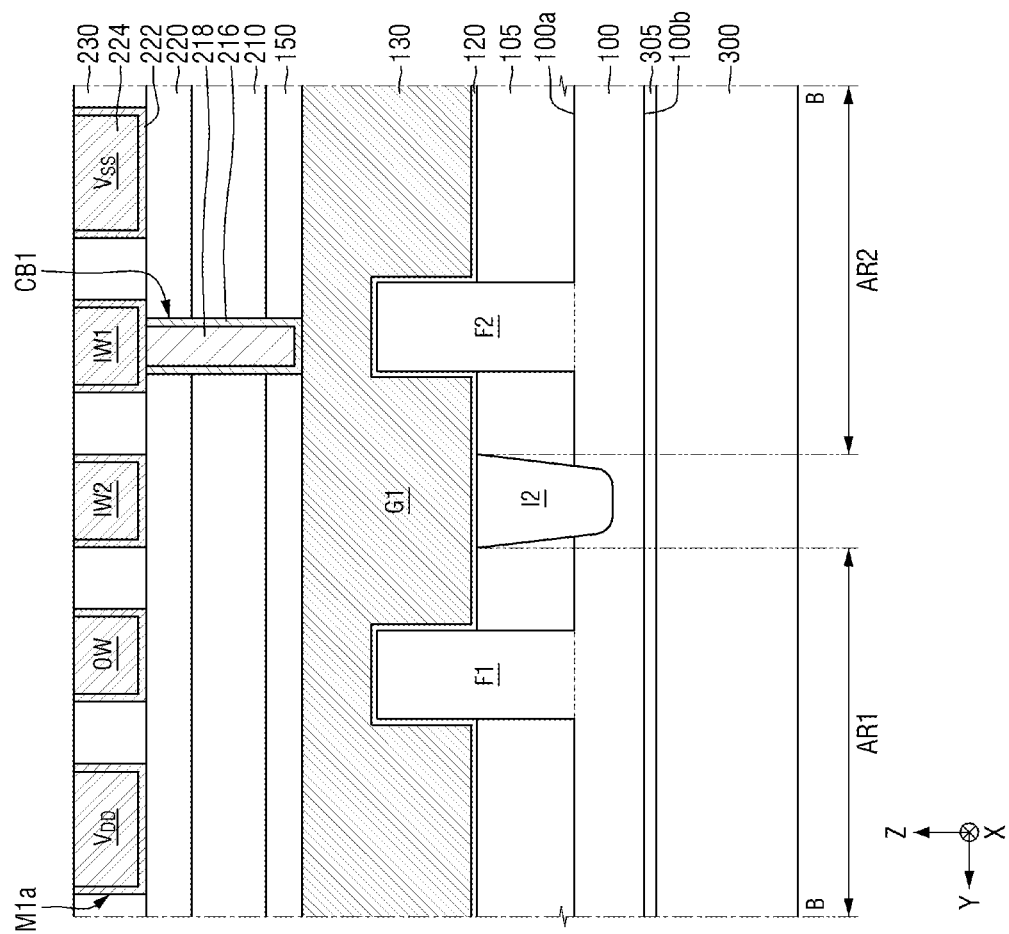
FIG. 5 is a cross-sectional view taken along B-B of FIG. 3.
Figure 6:
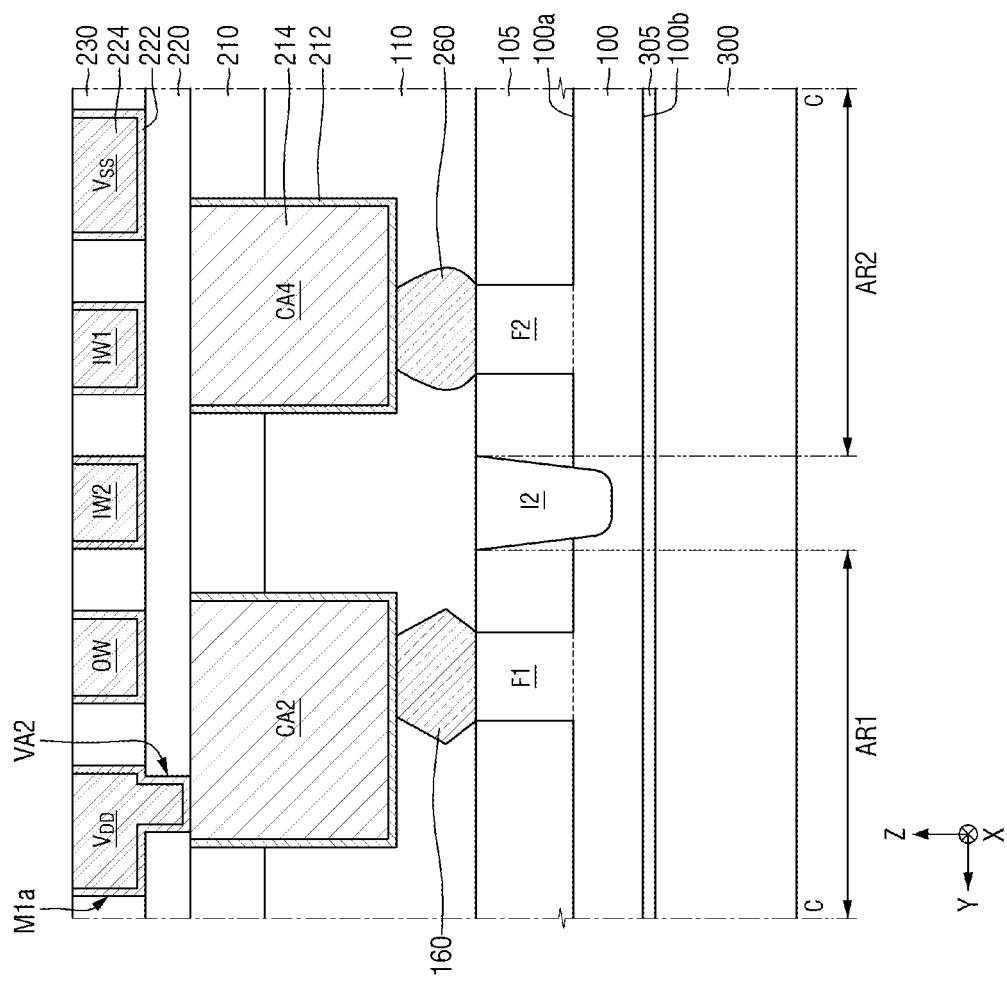
FIG. 6 is a cross-sectional view taken along C-C of FIG. 3.
Figure 7:
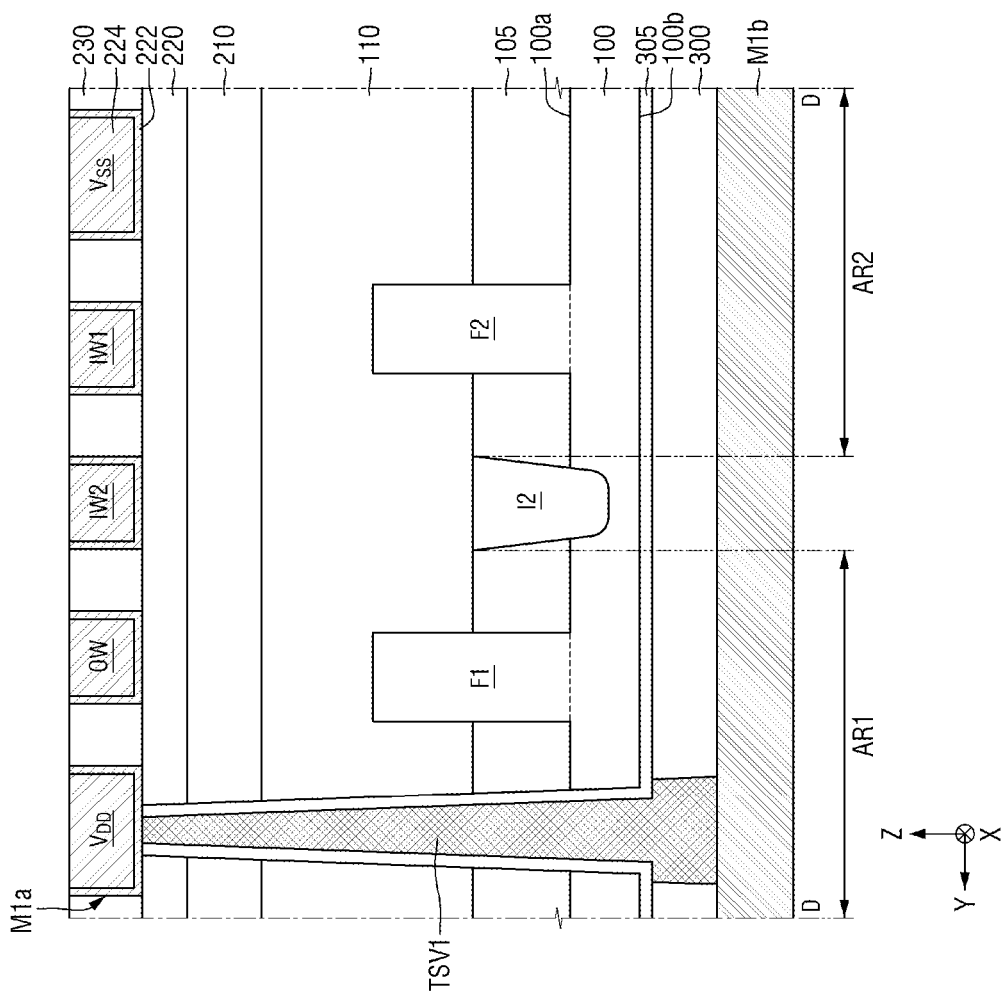
FIG. 7 is a cross-sectional view taken along D-D of FIG. 3.

FIG. 3 is a layout diagram that illustrates a region R of FIG. 1. FIG. 4 is a cross-sectional view taken along A-A of FIG. 3. FIG. 5 is a cross-sectional view taken along B-B of FIG. 3. FIG. 6 is a cross-sectional view taken along C-C of FIG. 3. FIG. 7 is a cross-sectional view taken along D-D of FIG. 3.

In FIGS. 3 to 7, the standard cell provided to the standard cell region SC embodies a 2-input NAND (NAND2) cell. For example, referring to FIGS. 3 to 7, the standard cells provided to the standard cell region SC may include a first active region AR1, a second active region AR2, a first gate electrode G1, a second gate electrode G2, source/drain contacts CA1 to CA5, contact vias VA1 to VA4, gate contacts CB1 and CB2, first to third front wiring Patterns IW1, IW2, and OW, a first power wiring $V_{DD}$, and a second power wiring $V_{SS}$.

Further, in FIGS. 3 to 7, although a fin-type transistor FinFET including a channel region of a fin-type pattern is shown as a semiconductor device provided to the standard cell region SC, this is only an example. As another example, the semiconductor device provided to the standard cell region SC may include a tunneling transistor (tunneling FET), a transistor including nanowires, a transistor including nanosheets, a VFET (Vertical FET), a CFET (Complementary FET) or a three-dimensional (3D) transistor. In other embodiments, the semiconductor device provided to the standard cell region SC may also include a bipolar junction transistor, a laterally-diffused metal-oxide semiconductor (LDMOS), and the like.

In some embodiments, the standard cell region SC may be defined by a first cell separation pattern I1a and a second cell separation pattern I1b arranged along the first direction X. For example, the first cell separation pattern I1a and the second cell separation pattern I1b may extend side by side in the second direction Y. The standard cell region SC may be defined between the first cell separation pattern I1a and the second cell separation pattern I1b.

The first active region AR1 and the second active region AR2 may extend side by side. For example, the first active region AR1 and the second active region AR2 may each extend in the first direction X. The first active region AR1 and the second active region AR2 may be arranged along the second direction Y.

In some embodiments, semiconductor elements (e.g., transistors) of different conductive types may be formed on the first active region AR1 and the second active region AR2. Hereinafter, the first active region AR1 will be described as a PFET region and the second active region AR2 will be described as a NFET region. However, this is only an example, and the first active region AR1 may be the NFET region and the second active region AR2 may be the PFET region.

In some embodiments, the first active region AR1 and the second active region AR2 may be separated by an element separation pattern I2. For example, as shown in FIGS. 5 and 7, the element separation pattern I2 may extend in the first direction X to separate the first active region AR1 and the second active region AR2.

The first active region AR1 may include a first active pattern F1, and the second active region AR2 may include a second active pattern F2. In some embodiments, the first and second active patterns F1 and F2 may each include a fin-type pattern protruding from the first surface 100a of the substrate 100.

The first and second active patterns F1 and F2 may be spaced apart from each other and extend side by side. For example, each of the first and second active patterns F1 and F2 may extend in the first direction X. In addition, the first and second active patterns F1 and F2 may be arranged side by side along the second direction Y. Accordingly, the first and second cell separation patterns I1a and I1b may cross the first and second active patterns F1 and F2.

In some embodiments, a field insulating film 105 may be formed on the first surface 100a of the substrate 100. In some embodiments, the field insulating film 105 may border or surround at least a part of the sides of the first and second active patterns F1 and F2. For example, as shown in FIGS. 5 to 7, a part of the first and second active patterns F1 and F2 may protrude upward from the field insulating film 105.

The field insulating film 105 may include, but is not limited to, for example, at least one of silicon oxide ($SiO_2$), silicon nitride (SiN), silicon oxynitride (SiON), silicon oxycarbonitride (SiOCN) or a combination thereof.

Each of the first gate electrode G1 and the second gate electrode G2 may be interposed between the first cell separation pattern I1a and the second cell separation pattern I1b. Each of the first gate electrode G1 and the second gate electrode G2 may intersect the first active pattern F1 and the second active pattern F2. For example, each of the first gate electrode G1 and the second gate electrode G2 may extend side by side in the second direction Y.

In some embodiments, the first gate electrode G1 and the second gate electrode G2 may be adjacent to each other and arranged sequentially along the first direction X. That is, another gate electrode or another cell separation pattern may not be placed between the first gate electrode G1 and the second gate electrode G2. As used herein, adjacent gate electrodes are referred to as being separated by 1 gate pitch. The 1 gate pitch may be, but is not limited to, for example, 30 nm to 60 nm. As an example, the 1 gate pitch may be 50 nm to 60 nm. As another example, the 1 gate pitch may be between 40 nm and 50 nm. As another example, the 1 gate pitch may be 30 nm to 40 nm.

In some embodiments, each of the first cell separation pattern I1a and the second cell separation pattern I1b may be spaced apart from adjacent gate electrodes by 1 gate pitch. As an example, the first gate electrode G1 and the first cell separation pattern I1a may be spaced apart by 1 gate pitch, and the second gate electrode G2 and the second cell separation pattern I1b may be spaced part by 1 gate pitch.

The first and second gate electrodes G1 and G2 may each include a gate conductive film 130. The gate conductive film 130 may include, but is not limited to, for example, at least one of Ti, Ta, W, Al, Co and combinations thereof. The gate conductive film 130 may also include, for example, silicon or silicon germanium.

Although the gate conductive film 130 is shown as a single film, embodiments of the inventive concept are not limited thereto. Unlike that shown, the gate conductive film 130 may also be formed by stacking a plurality of conductive materials. For example, the gate conductive film 130 may include a work function adjusting film that adjusts the work function, and a filling conductive film that is in and at least partially fills the space formed by the work function adjusting film. The work function adjusting film may include, for example, at least one of TiN, TaN, TiC, TaC, TiAlC and combinations thereof. The filling conductive film may include, for example, W or Al. Such a gate conductive film 130 may be formed, but is not limited to, for example, through a replacement process.

A gate dielectric film 120 may be interposed between the first and second active patterns F1 and F2 and the gate conductive film 130. For example, the gate dielectric film 120 may extend along the side surfaces and bottom surface of the gate conductive film 130. However, embodiments of the inventive concept are not limited thereto, and the gate dielectric film 120 may extend only along the bottom surface of the gate conductive film 130.

In some embodiments, a part of the gate dielectric film 120 may be interposed between the field insulating film 105 and the gate conductive film 130. For example, as shown in FIG. 5, the gate dielectric film 120 may extend along the upper surface of the field insulating film 105.

The gate dielectric film 120 may include, for example, at least one of silicon oxide, silicon oxynitride, silicon nitride, a high dielectric constant (high-k) material having a dielectric constant higher than silicon oxide, and combinations thereof. The high dielectric constant material may include, but is not limited to, for example, hafnium oxide.

The gate spacer 140 may be formed on the substrate 100 and the field insulating film 105. The gate spacer 140 may extend along both side surfaces of the gate conductive film 130. For example, the gate spacer 140 may extend in the second direction Y to be on and at least partially cover both side surfaces of the gate conductive film 130.

The gate spacer 140 may include, but is not limited to, for example, at least one of silicon oxide, silicon nitride, silicon oxynitride, and combinations thereof.

A gate capping pattern 150 may extend along the upper surface of the gate conductive film 130. For example, the gate capping pattern 150 may extend in the second direction Y to be on and at least partially cover the upper surface of the gate conductive film 130.

A first source/drain region 160 may be formed on the first active region AR1. For example, the first source/drain region 160 may be formed inside the first active pattern F1 on both sides of the gate conductive film 130. The first source/drain region 160 may be spaced apart from the gate conductive film 130 by a gate spacer 140.

A second source/drain region 260 may be formed on the second active region AR2. For example, the second source/drain region 260 may be formed inside the second active pattern F2 on both sides of the gate conductive film 130. The second source/drain region 260 may be spaced apart from the gate conductive film 130 by the gate spacer 140.

In some embodiments, each of the first source/drain region 160 and the second source/drain region 260 has an epitaxial layer formed inside the first and second active patterns F1 and F2.

When the semiconductor device formed in the first active region AR1 is a PFET, the first source/drain region 160 may include p-type impurities or impurities for reducing or preventing diffusion of p-type impurities. For example, the first source/drain region 160 may include at least one of B, C, In, Ga, and Al or a combination thereof.

When the semiconductor device formed in the second active region AR2 is an NFET, the second source/drain region 260 may include n-type impurities or impurities for reducing or preventing diffusion of n-type impurities. For example, the second source/drain region 260 may include at least one of P, Sb, As, or a combination thereof.

Although the first source/drain region 160 and the second source/drain region 260 are each shown as a single film, embodiments of the inventive concept are not limited thereto. For example, each of the first source/drain region 160 and the second source/drain region 260 may be formed of multi-films each including impurities of different concentrations from each other.

Source/drain contacts CA1 to CA5 may be placed on both sides of the first and second gate electrodes G1 and G2. Further, the source/drain contacts CA1 to CA5 may be connected to the first source/drain region 160 of the first active pattern F1 or the second source/drain region 260 of the second active pattern F2. For example, a first source/drain contact CA1 may be formed on the first active pattern F1 and the second active pattern F2 between the first gate electrode G1 and the first cell separation pattern I1a. A second source/drain contact CA2 may be formed on the first active pattern F1 between the first gate electrode G1 and the second gate electrode G2. A third source/drain contact CA3 may be formed on the first active pattern F1 between the second gate electrode G2 and the second cell separation pattern I1b. A fourth source/drain contact CA4 may be formed on the second active pattern F2 between the first gate electrode G1 and the second gate electrode G2. A fifth source/drain contact CA5 may be formed on the second active pattern F2 between the second gate electrode G2 and the second cell separation pattern I1b.

Contact vias VA1 to VA4 may be placed to correspond to the source/drain contacts CA1 to CA5. Further, the contact vias VA1 to VA4 may be connected to the source/drain contacts CA1 to CA5. For example, a first contact via VA1 may be connected to the first source/drain contact CA1. A second contact via VA2 may be connected to the second source/drain contact CA2. A third contact via VA3 may be connected to the third source/drain contact CA3. A fourth contact via VA4 may be connected to the fifth source/drain contact CA5.

Gate contacts CB1 and CB2 may be placed to correspond to the first gate electrode G1 or the second gate electrode G2. Further, the gate contacts CB1 and CB2 may be connected to the first gate electrode G1 or the second gate electrode G2. For example, the first gate contact CB1 may be connected to the first gate electrode G1, and the second gate contact CB2 may be connected to the second gate electrode G2.

The first to third front wiring patterns IW1, IW2, and OW may each extend in the first direction X. The first to third front wiring patterns IW1, IW2, and OW may be placed at the same routing level as each other. In some embodiments, the first to third front wiring patterns IW1, IW2, and OW may be placed at the same routing level as the first power wiring $V_{DD}$ and the second power wiring $V_{SS}$.

In some embodiments, the first to third front wiring patterns IW1, IW2, and OW may be placed at the lowermost part of the front routing wirings (e.g., M1a, M2a, M3a and M4a of FIG. 2). For example, the first front routing wiring M1a may include first to third front wiring patterns IW1, IW2, and OW.

In some embodiments, the first to third front wiring patterns IW1, IW2, and OW may be interposed between the first power wiring $V_{DD}$ and the second power wiring $V_{SS}$. For example, a routing region RA may be defined between the first power wiring $V_{DD}$ and the second power wiring $V_{SS}$. The routing region RA may include, for example, first to third routing tracks I to III arranged sequentially along the second direction Y. Each of the first to third front wiring patterns IW1, IW2, and OW may be placed in one of the first to third routing tracks I to III.

The first to third front wiring patterns IW1, IW2, and OW may be connected to a part of the source/drain contacts CA1 to CA5 or a part of the gate contacts CB1 and CB2.

As an example, the first front wiring pattern IW1 may be placed inside the third routing track III and connected to the first gate contact CB1. Accordingly, the first gate electrode G1 may be connected to the first front wiring pattern IW1. The first front wiring pattern IW1 may function as a first input wiring that provides the first input signal to the standard cell region SC.

As an example, the second front wiring pattern IW2 may be placed inside the second routing track II and connected to the second gate contact CB2. As a result, the second gate electrode G2 may be connected to the second front wiring pattern IW2. The second front wiring pattern IW2 may function as a second input wiring that provides a second input signal to the standard cell region SC.

As an example, the third front wiring pattern OW may be placed inside the first routing track I and connected to the first contact via VA1 and the third contact via VA3. Therefore, the first source/drain contact CA1 and the third source/drain contact CA3 may be connected to the third front wiring pattern OW. The third front wiring pattern OW may function as an output wiring that provides the output signal from the standard cell region SC.

The first power wiring $V_{DD}$ may be connected to some of the source/drain contacts CA1 to CA5. For example, the first power wiring $V_{DD}$ may be connected to the second contact via VA2. As a result, the second source/drain contact CA2 may be connected to the first power wiring $V_{DD}$.

The second power wiring $V_{SS}$ may be connected to some others of the source/drain contacts CA1 to CA5. For example, the second power wiring $V_{SS}$ may be connected to the fourth contact via VA4. Accordingly, the fifth source/drain contact CA5 may be connected to the second power wiring $V_{SS}$.

First to fourth interlayer insulating films 110, 210, 220, and 230 may be formed on the first surface 100a of the substrate 100. The first to fourth interlayer insulating films 110, 210, 220, and 230 may be sequentially stacked on the first surface 100a of the substrate 100. The first to fourth interlayer insulating films 110, 210, 220, and 230 may correspond to the front interlayer insulating film 200 of FIG. 2.

The first to fourth interlayer insulating films 110, 210, 220, and 230 may include, but are not limited to, for example, at least one of silicon oxide, silicon nitride, silicon oxynitride, and low dielectric constant (low-k) material having a lower dielectric constant than silicon oxide.

The first interlayer insulating film 110 may cover, for example, the field insulating film 105, the first source/drain region 160 and the second source/drain region 260. The second interlayer insulating film 210 may, for example, be formed on the first interlayer insulating film 110 to at least partially cover the gate capping pattern 150.

The source/drain contacts CA1 to CA5 may, for example, penetrate the first interlayer insulating film 110 and the second interlayer insulating film 210 and be connected to the first source/drain region 160 or the second source/drain region 260.

The gate contacts CB1 and CB2 may, for example, penetrate the gate capping pattern 150, the first interlayer insulating film 110, the second interlayer insulating film 210, and the third interlayer insulating film 220, and be connected to the gate conductive film 130.

The contact vias VA1 to VA4 may, for example, penetrate the third interlayer insulating film 220, and be connected to the source/drain contacts CA1 to CA5. Although the upper surfaces of the gate contacts CB1 and CB2 are only shown as being placed at the same level as the upper surfaces of the contact vias VA1 to VA4, this is only an example. As another example, the upper surfaces of the gate contacts CB1 and CB2 may be placed at the same level as the upper surfaces of the source/drain contacts CA1 to CA5. In such a case, contact vias corresponding to and connected to the gate contacts CB1 and CB2 may be further formed.

The first front routing wiring M1a may be, for example, placed inside the fourth interlayer insulating film 230.

In some embodiments, the source/drain contacts CA1 to CA5, the contact vias VA1 to VA4, the gate contacts CB1 and CB2, the first to third front wiring patterns IW1, IW2, and OW, the first power wiring $V_{DD}$ and the second power wiring $V_{SS}$ may each include barrier films 212, 216, and 222, and filling films 214, 218, and 224.

The barrier films 212, 216, and 222 may be interposed between the interlayer insulating films 110, 210, 220, and 230 and the filling films 214, 218, and 224. The barrier films 212, 216, and 222 may include a metal or metal nitride for reducing or preventing diffusion of the filling films 214, 218, and 224. For example, the barrier films 212, 216, and 222 may include, but is not limited to, at least one of titanium (Ti), tantalum (Ta), tungsten (W), nickel (Ni), cobalt (Co), platinum (Pt), alloys and nitrides thereof.

The filling films 214, 218, and 224 may at least partially fill spaces in the interlayer insulating films 110, 210, 220, and 230, which remain after the barrier films 212, 216, and 222 are formed. The filling films 214, 218, and 224 may include, but are not limited to, at least one of aluminum (Al), copper (Cu), tungsten (W), molybdenum (Mo), cobalt (Co) and alloys thereof.

Although the contact vias VA1 to VA4, the first to third front wiring patterns IW1, IW2, and OW, the first power wiring $V_{DD}$ and the second power wiring $V_{SS}$ are only shown as being formed by a dual damascene process, this is only an example, and these may be formed by a single damascene process or other wiring process.

The first tab cell region TC1 may be arranged with the standard cell region SC along the first direction X. For example, the first tab cell region TC1 may be defined by the third cell separation pattern I1c arranged with the first cell separation pattern I1a along the first direction X. For example, the third cell separation pattern I1c and the first cell separation pattern I1a may extend side by side in the second direction Y. The first tab cell region TC1 may be defined between the third cell separation pattern I1c and the first cell separation pattern I1a.

The first through via TSV1 may be placed inside the first tab cell region TC1. The first through via TSV1 may connect the first power wiring $V_{DD}$ and the first back routing wiring M1b. As an example, the first through via TSV1 may penetrate the substrate 100, the field insulating film 105, the first interlayer insulating film 110, the second interlayer insulating film 210, and the third interlayer insulating film 220, and connect the first power wiring $V_{DD}$ and the first back wiring pattern BW11.

In some embodiments, an insulating spacer film 305 may be formed between the substrate 100 and the first through via TSV1. The insulating spacer film 305 may electrically insulate the first through via TSV1 from the substrate 100. The insulating spacer film 305 may include, but is not limited to, for example, at least one of silicon oxide, silicon nitride, silicon oxynitride, and combinations thereof.

In some embodiments, the insulating spacer film 305 may further extend along the side surfaces of the field insulating film 105, the side surfaces of the first interlayer insulating film 110, the side surfaces of the second interlayer insulating film 210, the side surfaces of the third interlayer insulating film 220, and the second surface 100b of the substrate 100. For example, a trench that extends from the second surface 100b of the substrate 100 to expose the first power wiring $V_{DD}$ may be formed. The insulating spacer film 305 may extend along the profiles of the second surface 100b of the substrate 100 and the trench. The first through via TSV1 may be formed to at least partially fill the trench.

The second tab cell region TC2 may be arranged with the standard cell region SC along the first direction X. For example, the second tab cell region TC2 may be defined by a fourth cell separation pattern I1d arranged the second cell separation pattern I1b along the first direction X. For example, the second cell separation pattern I1b and the fourth cell separation pattern I1d may extend side by side in the second direction Y. The second tab cell region TC2 may be defined between the second cell separation pattern I1b and the fourth cell separation pattern I1d.

The second through via TSV2 may be placed inside the second tab cell region TC2. The second through via TSV2 may connect the second power wiring $V_{SS}$ and the first back routing wiring M1b. Because the second through via TSV2 may be similar to the first through via TSV1, except that it is connected to the second power wiring $V_{SS}$ other than the first power wiring $V_{DD}$, a detailed description thereof will not be provided.

As semiconductor devices are increasingly highly integrated, the width of wiring patterns which implement the semiconductor devices may gradually decrease. As a result, a voltage drop (e.g., IR drop) of a power delivery network (PDN) that supplies the power voltage to the standard cell may become an important issue.

In the semiconductor device according to some embodiments, the power delivery network (PDN) may have a reduced voltage drop by being mounted on the back side (e.g., the second surface 100b) of the substrate 100. Specifically, as described above, the first back routing wiring M1b supplied with power from the outside may be placed on the second surface 100b of the substrate 100. Further, the first back routing wiring M1b may provide the power voltage to the standard cell region SC through the first tab cell region TC1 and/or the second tab cell region TC2. As a result, the first back routing wiring M1b may be formed to be relatively large on the second surface 100b of the substrate 100, as compared to the power delivery network (PDN) mounted on the first surface 100a of the substrate 100. That is, the power delivery network (PDN) of the semiconductor device according to some embodiments may have a relatively reduced voltage drop due to the placement on the back side of the substrate.

Also, the semiconductor device according to some embodiments may provide additional PnR (Placement and Routing) resources on the front side (e.g., the first surface 100a) of the substrate 100. For example, as compared to a case where the power delivery network (PDN) is mounted on the first surface 100a of the substrate 100, the semiconductor device according to some embodiments may provide the additional PnR resource to the first to fourth front routing wirings M1a, M2a, M3a and M4a. Therefore, a semiconductor device having an improved PPA (Power, Performance, Area) may be provided.

Figure 8:
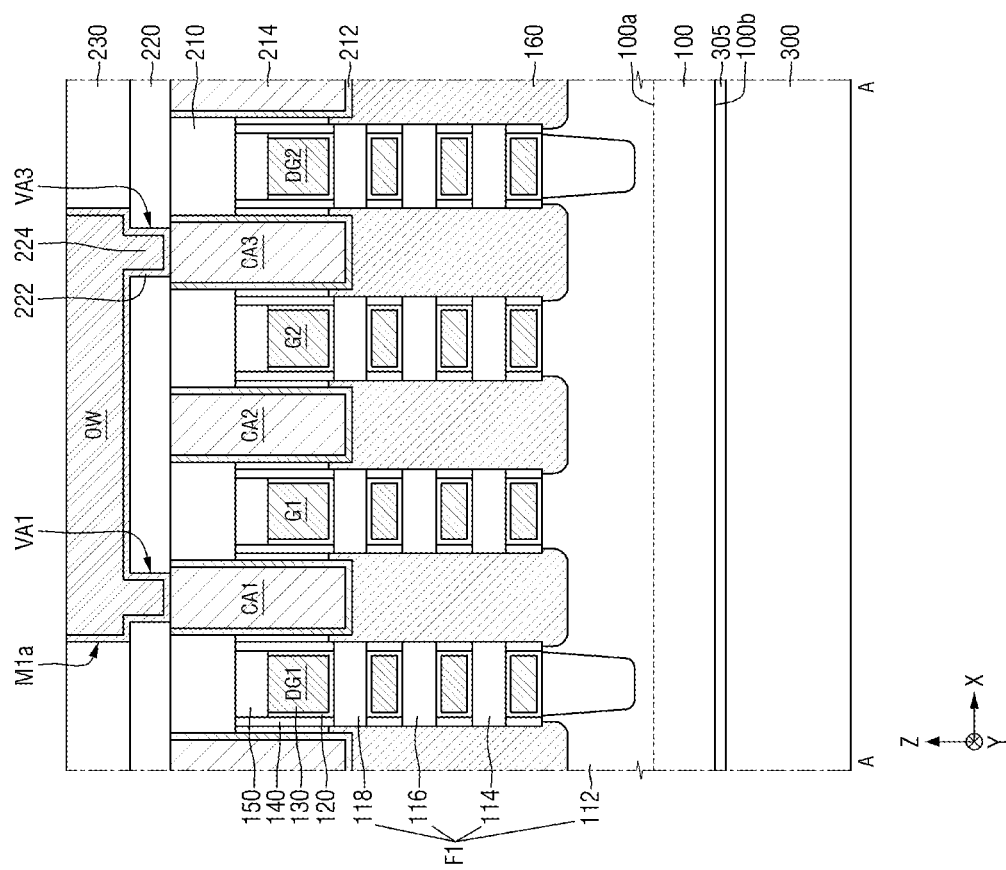
FIGS. 8 and 9 are cross-sectional views that illustrate a semiconductor device according to some embodiments of the inventive concept.
Figure 9:
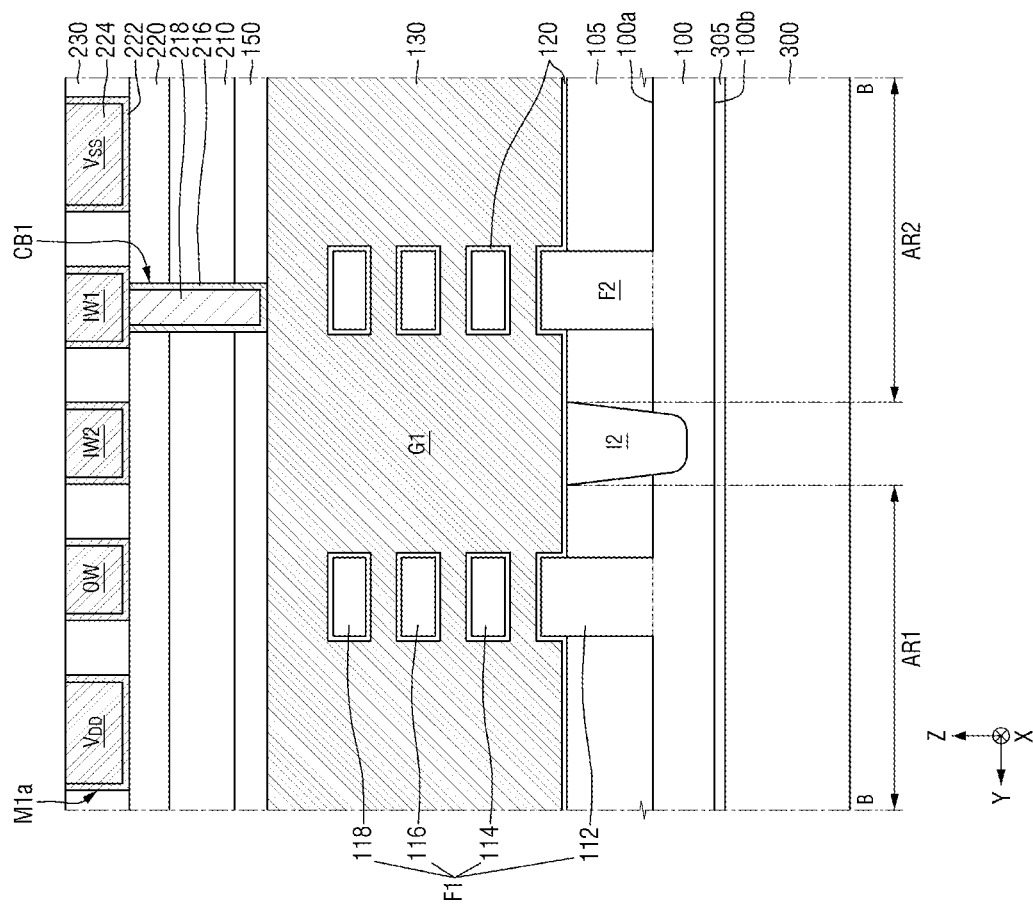

FIGS. 8 and 9 are cross-sectional views that illustrate a semiconductor device according to some embodiments of the inventive concept. For reference, FIG. 8 is another cross-sectional view taken along A-A of FIG. 3, and FIG. 9 is another cross-sectional view taken along B-B of FIG. 3. For convenience of explanation, repeated parts of embodiments described above using FIGS. 1 to 7 will be briefly described or omitted.

Referring to FIGS. 8 and 9, in a semiconductor device according to some embodiments, the first and second active patterns F1 and F2 each include a plurality of wire patterns 114, 116, and 118.

For example, the first and second active patterns F1 and F2 may include first to third wiring patterns 114, 116 and 118, which are sequentially stacked on the first surface 100a of the substrate 100 and spaced apart from each other. As an example, the first wire pattern 114 may be spaced from the substrate 100 in the third direction Z, the second wire pattern 116 may be spaced from the first wire pattern 114 in the third direction Z, and the third wire pattern 118 may be spaced apart from the second wire pattern 116 in the third direction Z.

The first to third wire patterns 114, 116, and 118 may each extend in the first direction X. Further, the first to third wire patterns 114, 116, and 118 may each penetrate the first and second gate electrodes G1 and G2. Therefore, as shown in FIG. 9, the first and second gate electrodes G1 and G2 may border or surround the outer peripheral surfaces of the first to third wire patterns 114, 116, and 118.

Although FIG. 9 shows that the cross-sections of the first to third wire patterns 114, 116, and 118 are rectangular, this is only an example. For example, each of the cross-sections of the first to third wire patterns 114, 116, and 118 may be other polygons or circles.

In some embodiments, each of the first and second active patterns F1 and F2 may further include a fin-type pattern 112, which protrudes from the first surface 100a of the substrate 100 and extends in the first direction X. The first wire pattern 114 may be spaced apart from, for example, the fin-type pattern 112 in the third direction Z.

Figure 10:
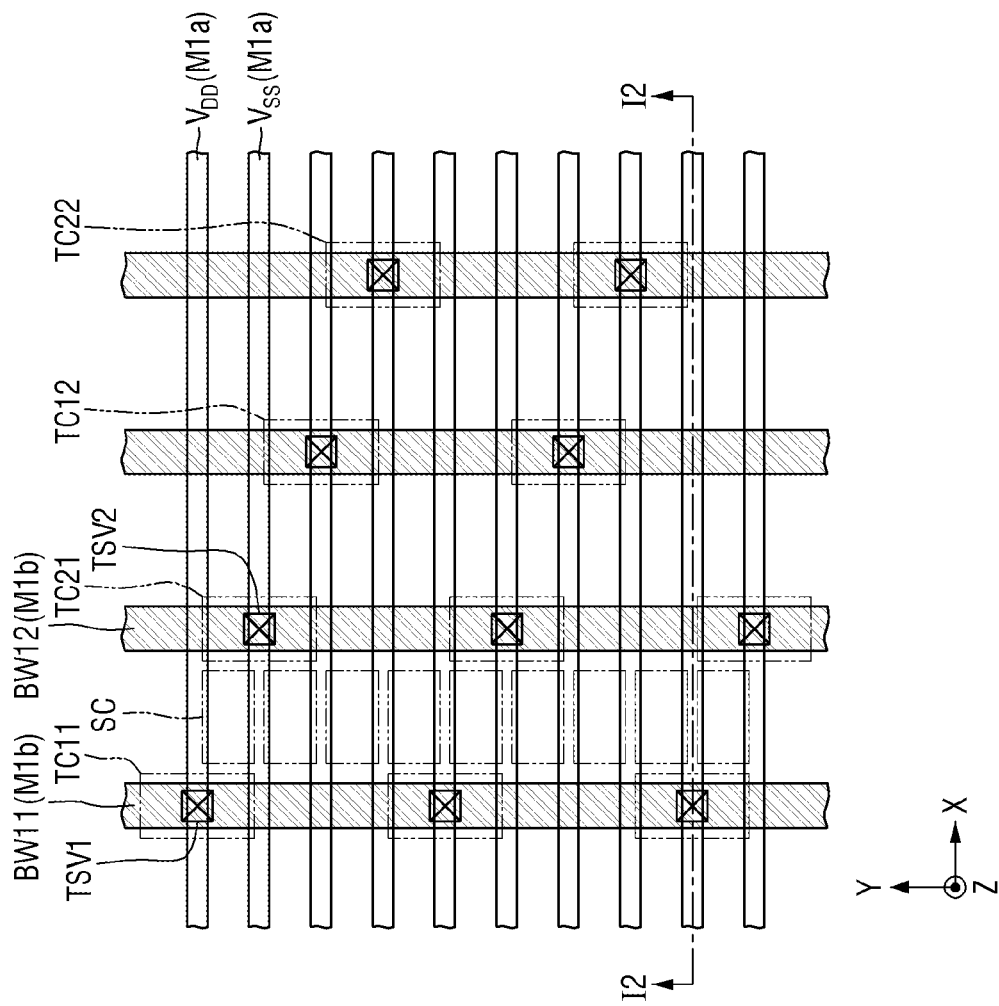
FIG. 10 is a schematic layout diagram that illustrate a semiconductor device according to some embodiments of the inventive concept.
Figure 11:
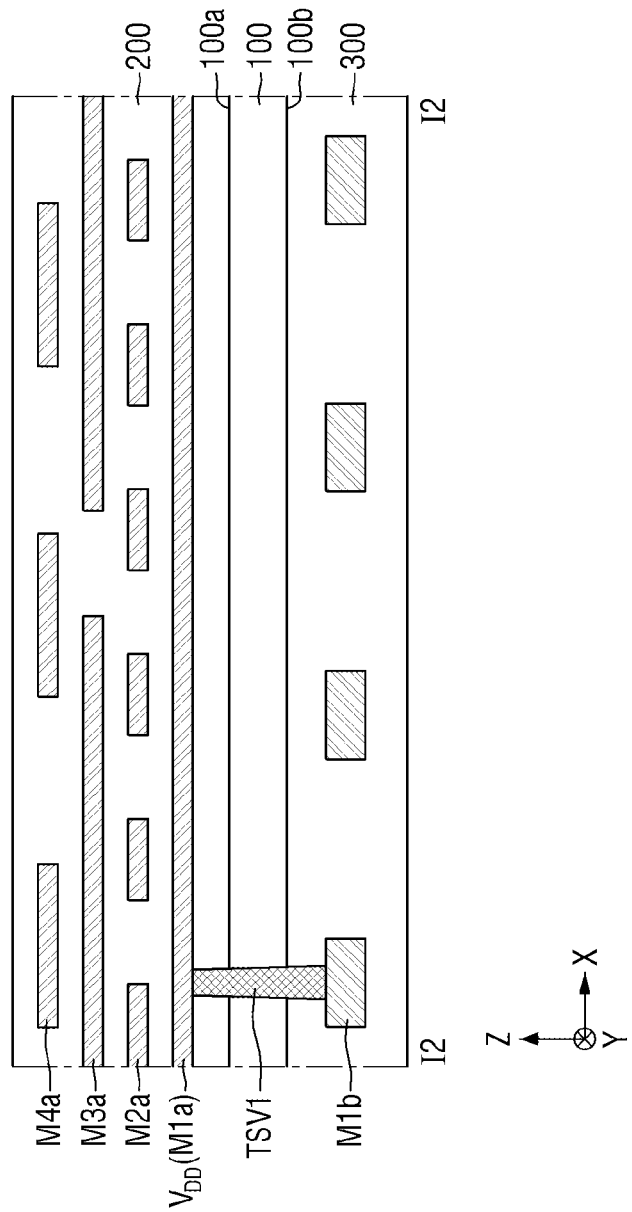
FIG. 11 is a schematic cross-sectional view taken along I2-I2 of FIG. 10.

FIG. 10 is a schematic layout diagram that illustrates a semiconductor device according to some embodiments of the inventive concept. FIG. 11 is a schematic cross-sectional view taken along 12-12 of FIG. 10. For convenience of explanation, repeated parts of embodiments described above using FIGS. 1 to 9 will be briefly described or omitted.

Referring to FIGS. 10 and 11, in the semiconductor device according to some embodiments, the first through via TSV1 is placed inside a first subtab cell region TC11 and a second subtab cell region TC12, and the second through via TSV2 is placed inside a third subtab cell region TC21 and a fourth subtab cell region TC22.

The plurality of first subtab cell regions TC11 may be arranged along the second direction Y. The plurality of second subtab cell regions TC12 may be arranged along the second direction Y. The first subtab cell regions TC11 may be placed to correspond to some of the plurality of first power wirings $V_{DD}$, and the second subtab cell regions TC12 may be placed to correspond to some others of the plurality of first power wirings $V_{DD}$. As an example, the first subtab cell region TC11 and the second subtab cell region TC12 may be arranged alternately in the second direction Y.

In some embodiments, the first subtab cell regions TC11 may be arranged to intersect (e.g., in a zigzag form) the second subtab cell regions TC12. For example, a plurality of first subtab cell regions TC11 arranged along the second direction Y may be placed to be spaced apart from a plurality of second subtab cell regions TC12 arranged along the second direction Y in the first direction X.

The plurality of third subtab cell regions TC21 may be arranged along the second direction Y. The plurality of third fourth subtab cell regions TC22 may be arranged along the second direction Y. The subtab cell regions TC21 may be placed to correspond to a part of the plurality of second power wirings $V_{SS}$, and the fourth subtab cell regions TC22 may be placed to correspond to the other part of the plurality of second power wirings $V_{SS}$. As an example, the third subtab cell region TC21 and the fourth subtab cell region TC22 may be arranged alternately in the second direction Y.

In some embodiments, the third subtab cell regions TC21 may be arranged to intersect (e.g., in a zigzag form) the fourth subtab cell regions TC22. For example, the plurality of third subtab cell regions TC21 arranged along the second direction Y may be placed to be spaced apart from the plurality of fourth subtab cell regions TC22, which is arranged along the second direction Y, in the first direction X.

In some embodiments, the second subtab cell regions TC12 may be interposed between the third subtab cell regions TC21 and the fourth subtab cell regions TC22. In some embodiments, the third subtab cell regions TC21 may be interposed between the first subtab cell regions TC11 and the second subtab cell regions TC12.

Figure 12:
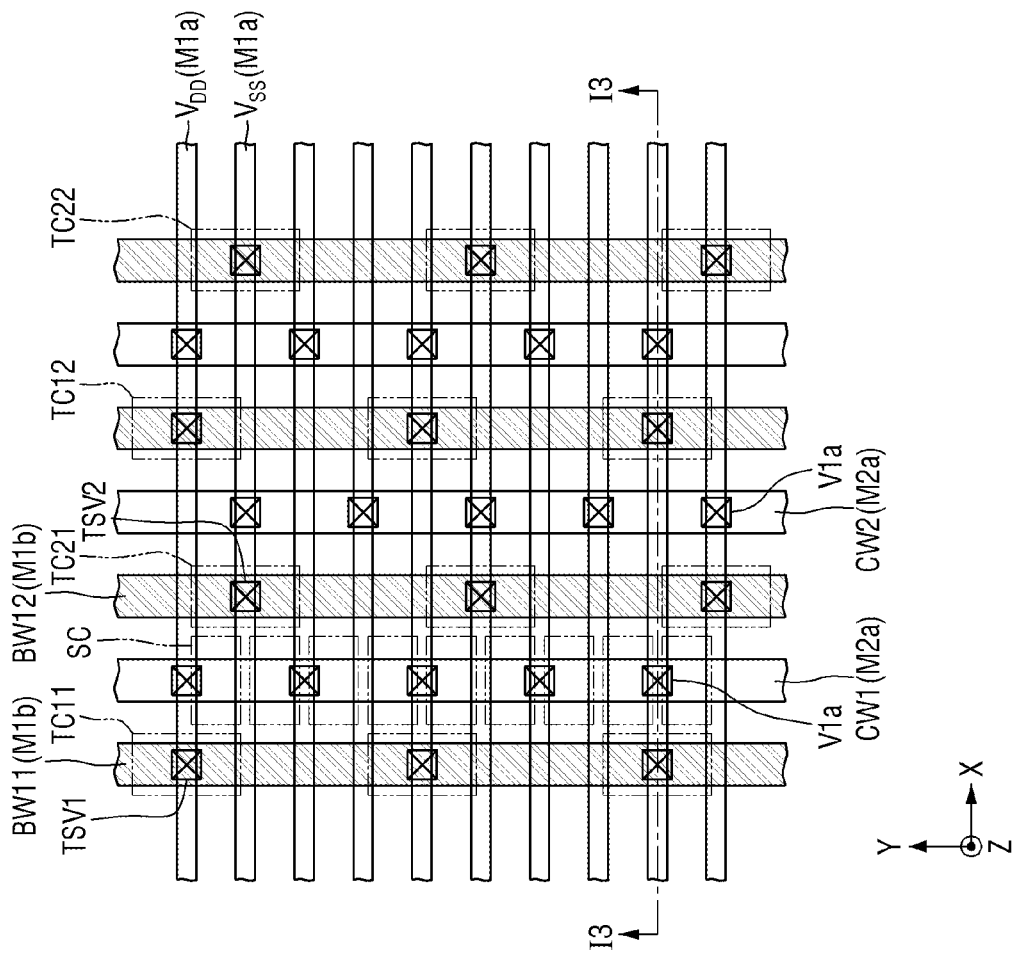
FIG. 12 is a schematic layout diagram that illustrate a semiconductor device according to some embodiments of the inventive concept.
Figure 13:
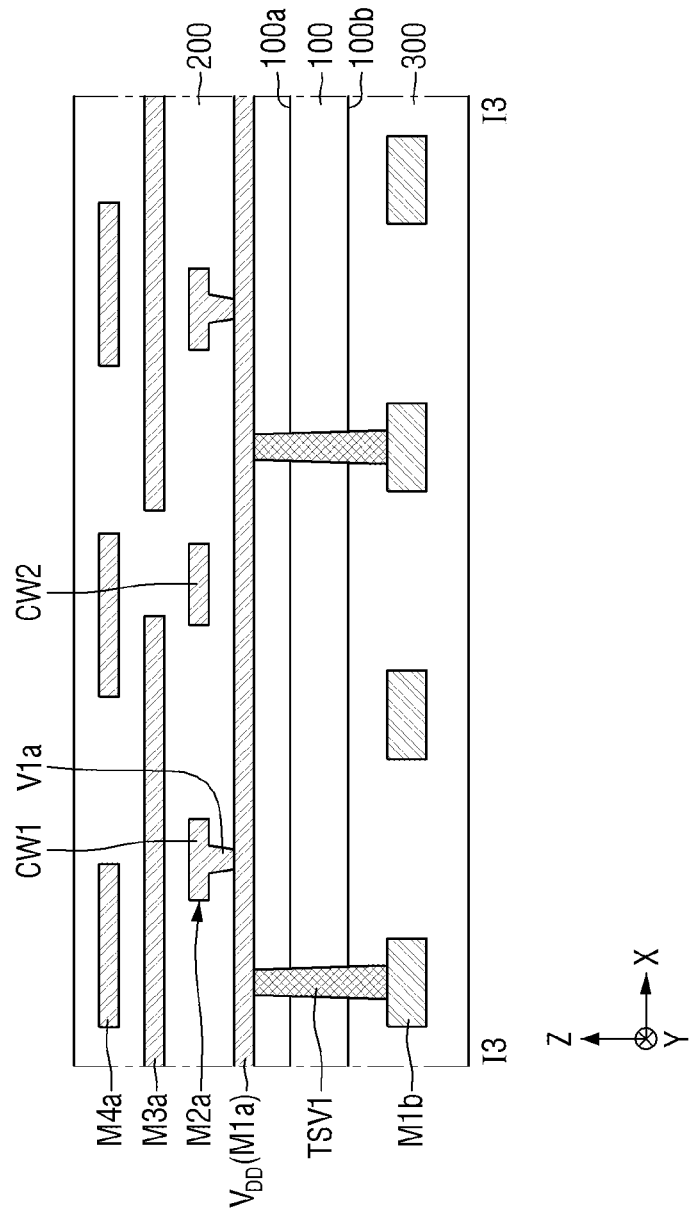
FIG. 13 is a schematic cross-sectional view taken along I3-I3 of FIG. 12.

FIG. 12 is a schematic layout diagram that illustrates a semiconductor device according to some embodiments of the inventive concept. FIG. 13 is a schematic cross-sectional view taken along I3-I3 of FIG. 12. For convenience of explanation, repeated parts of embodiments described above using FIGS. 1 to 11 will be briefly described or omitted.

Referring to FIGS. 12 and 13, in a semiconductor device according to some embodiments of the inventive concept, the first to fourth front routing wirings M1a, M2a, M3a and M4a further include a fourth front wiring pattern CW1 and a fifth front wiring pattern CW2.

The fourth front wiring pattern CW1 and the fifth front wiring pattern CW2 may be placed above the first power wiring $V_{DD}$ and the second power wiring $V_{SS}$. For example, the first front routing wiring M1a may be placed at a first front routing level, and the fourth front routing pattern CW1 and the fifth front routing pattern CW2 may be placed at a second front routing level, which is spaced apart from the first front routing level, from the first surface 100a of the substrate 100. As an example, the second front routing wiring M2a may include a fourth front wiring pattern CW1 and a fifth front wiring pattern CW2.

The fourth front wiring pattern CW1 may interconnect the first power wirings $V_{DD}$ spaced apart from each other. For example, front routing vias V1a which connect the first power wiring $V_{DD}$ and the second front routing wiring M2a may be formed in the front interlayer insulating film 200. The fourth front wiring pattern CW1 may interconnect the first power wirings $V_{DD}$ arranged along the second direction Y through the front routing vias V1a.

In some embodiments, the first subtab cell region TC11 and the second subtab cell region TC12 may not be placed in a part of the plurality of first power wirings $V_{DD}$. For example, the first subtab cell region TC11 and the second subtab cell region TC12 may be arranged along the first direction X. The fourth front wiring pattern CW1 may interconnect the first power wirings $V_{DD}$, in which the first and second subtab cell regions TC11 and TC12 are placed, with the first power wirings $V_{DD}$ in which the first and second subtab cell regions TC11 and TC12 are not placed. Therefore, the first power voltage may also be provided to the first power wirings $V_{DD}$ in which the first and second subtab cell regions TC11 and TC12 are not placed.

The fifth front wiring pattern CW2 may interconnect the second power wirings $V_{SS}$ spaced apart from each other. For example, the fifth front routing pattern CW2 may interconnect the second power wirings VSS arranged along the second direction Y through the front routing vias V1a.

In some embodiments, the third subtab cell region TC21 and the fourth subtab cell region TC22 may not be placed at a part of the plurality of second power wirings VSS. For example, the third subtab cell region TC21 and the fourth subtab cell region TC22 may be arranged along the first direction X. The fifth front wiring pattern CW2 may interconnect the second power wirings $V_{SS}$, in which the third and fourth subtab cell regions TC21 and TC22 are placed, with the second power wirings $V_{SS}$ in which the third and fourth subtab cell regions TC21 and TC22 are not placed. Therefore, the second power voltage may also be provided to the second power wirings $V_{SS}$ in which the third and fourth subtab cell regions TC21 and TC22 are not placed.

Figure 14:
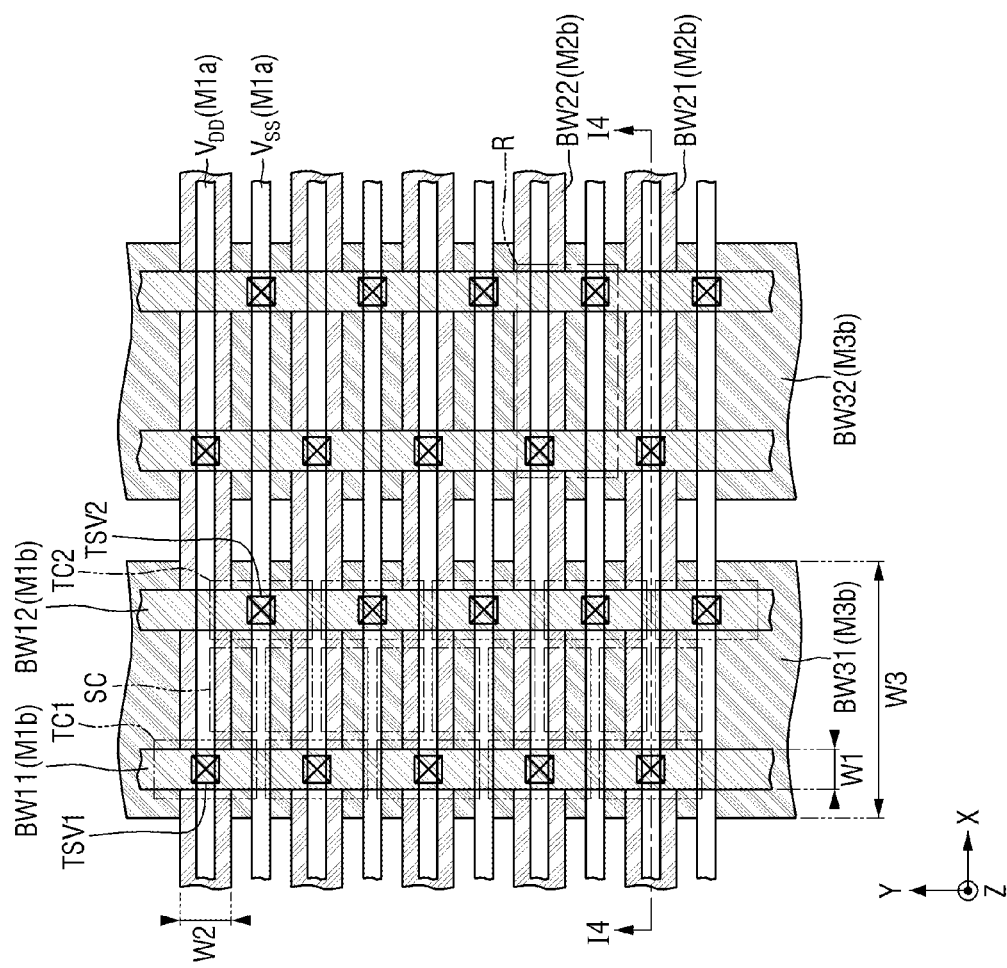
FIG. 14 is a schematic layout diagram that illustrate a semiconductor device according to some embodiments of the inventive concept.
Figure 15:
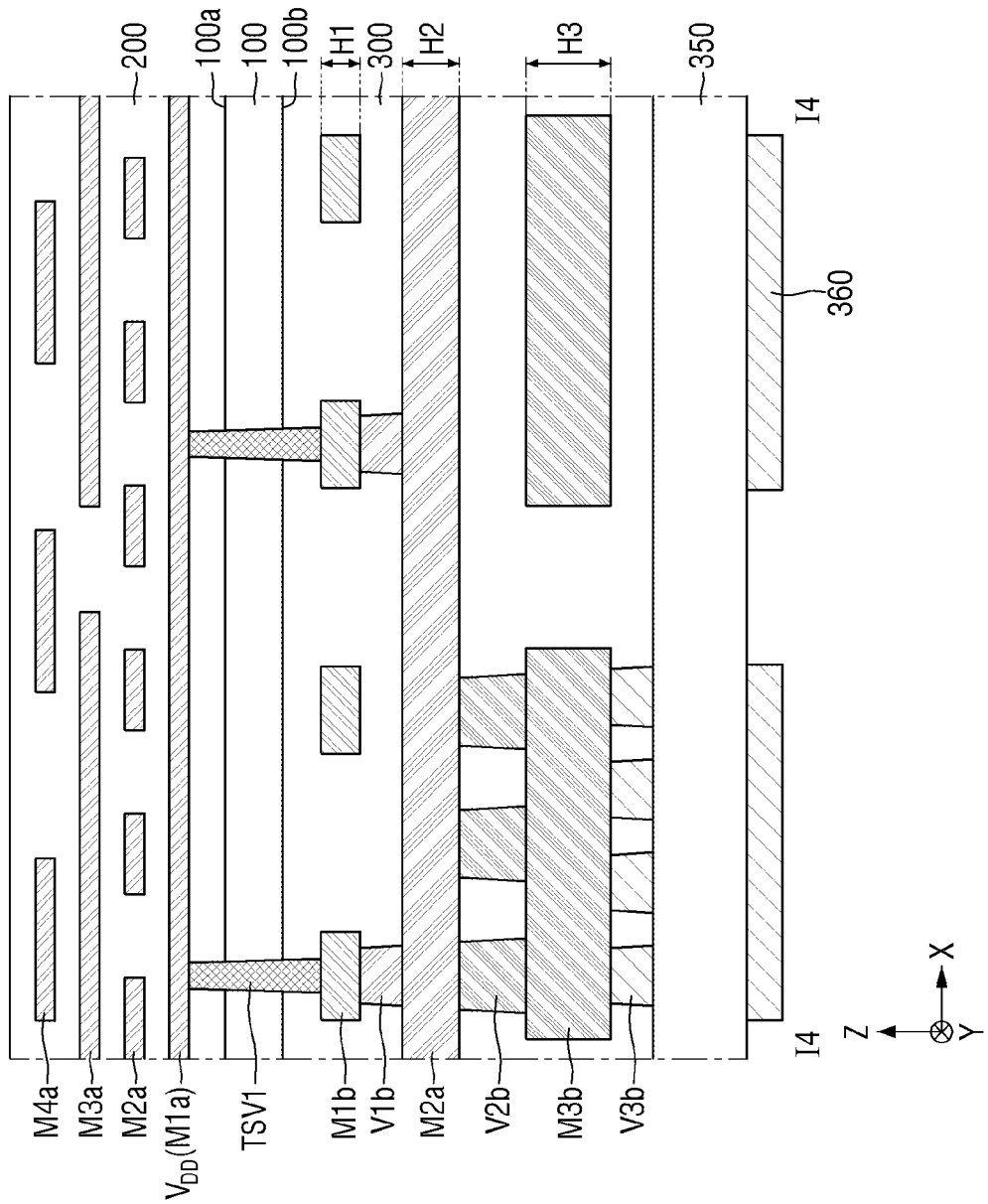
FIG. 15 is a schematic cross-sectional view taken along I4-I4 of FIG. 14.

FIG. 14 is a schematic layout diagram that illustrates a semiconductor device according to some embodiments of the inventive concept. FIG. 15 is a schematic cross-sectional view taken along I4-I4 of FIG. 14. For convenience of explanation, repeated parts of embodiments described above using FIGS. 1 to 9 will be briefly described or omitted.

Referring to FIGS. 14 and 15, the semiconductor device according to some embodiments further includes a second back routing wiring M2b, a third back routing wiring M3b, a redistribution layer 350, and a power pad 360.

The second back routing wiring M2b may be placed above the first back routing wiring M1b. For example, the first back routing wiring M1b may be placed at the first back routing level, and the second back routing wiring M2b may be placed at the second back routing level, which is spaced apart from the first back routing level, from the second surface 100b of the substrate 100. The second back routing wiring M2b may intersect the first back routing wiring M1b. In some embodiments, the second back routing wiring M2b may extend in the first direction X.

The second back routing wiring M2b may be connected to the first back routing wiring M1b. For example, first back routing vias V1b which connect the first back routing wiring M1b and the second back routing wiring M2b may be formed in the back interlayer insulating film 300.

In some embodiments, a width W2 of the second back routing wiring M2b may be greater than or equal to a width W1 of the first back routing wiring M1b. As an example, the width W1 of the first back routing wiring M1b may be about 0.1 μm to about 0.5 μm, and the width W2 of the second back routing wiring M2b may be about 0.4 μm to about 1.0 μm. In some embodiments, the width W1 of the first back routing wiring M1b may be about 0.3 μm to about 0.45 μm, and the width W2 of the second back routing wiring M2b may be about 0.45 μm to about 0.5 μm.

In some embodiments, a thickness H2 of the second back routing wiring M2b may be greater than or equal to a thickness H1 of the first back routing wiring M1b. As an example, the thickness H1 of the first back routing wiring M1b may be about 0.01 μm to about 0.5 μm, and the thickness H2 of the second back routing wiring M2b may be about 0.5 μm to about 2.0 μm. In some embodiments, the thickness H1 of the first back routing wiring M1b may be about 0.05 μm to about 0.1 μm, and the thickness H2 of the second back routing wiring M2b may be about 0.5 μm to about 1.0 μm.

In some embodiments, the second back routing wiring M2b may include a third back wiring pattern BW21 and a fourth back wiring pattern BW22. The third back wiring pattern BW21 and the fourth back wiring pattern BW22 may be spaced apart from each other and extend side by side. For example, the third back wiring pattern BW21 and the fourth back wiring pattern BW22 may each extend in the first direction X. The third back wiring pattern BW21 and the fourth back wiring pattern BW22 may be arranged along the second direction Y. In some embodiments, the third back wiring pattern BW21 and the fourth back wiring pattern BW22 may be arranged alternately in the second direction Y.

The third back wiring pattern BW21 may be connected to the first back wiring pattern BW11, and the fourth back wiring pattern BW22 may be connected to the second back wiring pattern BW12. For example, a part of the first back routing via V1b may connect the first back wiring pattern BW11 and the third back wiring pattern BW21, and the other of the first back routing via V1b may connect the second back wiring pattern BW12 and the fourth back wiring pattern BW22.

The third back routing wiring M3b may be placed above the second back routing wiring M2b. For example, the third back routing wiring M3b may be placed at a third back routing level, which is spaced apart from the second back routing level, from the second surface 100b of the substrate 100. The third back routing wiring M3b may intersect the second back routing wiring M2b. In some embodiments, the third back routing wiring M3b may extend in the second direction Y.

The third back routing wiring M3b may be connected to the second back routing wiring M2b. For example, second back routing vias V2b, which connect the second back routing wiring M2b and the third back routing wiring M3b, may be formed in the back interlayer insulating film 300.

In some embodiments, a width W3 of the third back routing wiring M3b may be greater than or equal to a width W2 of the second back routing wiring M2b. As an example, the width W2 of the second back routing wiring M2b may be about 0.4 μm to about 1.0 μm, and the width W3 of the third back routing wiring M3b may be about 1.0 μm to about 5.0 μm. In some embodiments, the width W2 of the second back routing wiring M2b may be about 0.45 μm to about 0.5 μm, and the width W3 of the third back routing wiring M3b may be about 3.0 μm to about 4.0 μm.

In some embodiments, the thickness H3 of the third back routing wiring M3b may be greater than or equal to the thickness H2 of the second back routing wiring M2b. As an example, the thickness H2 of the second back routing wiring M2b and the thickness H3 of the third back routing wiring M3b may each be about 0.5 μm to about 2.0 μm. In some embodiments, the thickness H2 of the second back routing wiring M2b and the thickness H3 of the third back routing wiring M3b may each be about 0.5 μm to about 1.0 μm.

In some embodiments, the third back routing wiring M3b may include a fifth back wiring pattern BW31 and a sixth back wiring pattern BW32. The fifth back wiring pattern BW31 and the sixth back wiring pattern BW32 may be spaced apart from each other and extend side by side. For example, the fifth back wiring pattern BW31 and the sixth back wiring pattern BW32 may each extend in the second direction Y. The fifth back wiring pattern BW31 and the sixth back wiring pattern BW32 may be arranged along the first direction X. In some embodiments, the fifth back wiring pattern BW31 and the sixth back wiring pattern BW32 may be arranged alternately in the first direction X.

The fifth back wiring pattern BW31 may be connected to the third back wiring pattern BW21, and the sixth back wiring pattern BW32 may be connected to the fourth back wiring pattern BW22. For example, a part of the second back routing vias V2b may connect the third back wiring pattern BW21 and the fifth back wiring pattern BW31, and the other of the second back routing vias V2b may connect the fourth back wiring pattern BW22 and the sixth back wiring pattern BW32.

The redistribution layer 350 may be connected to the third back routing wiring M3b. For example, third back routing vias V3b, which connect the third back routing wiring M3b and the redistribution layer 350, may be formed in the back interlayer insulating film 300.

The power pad 360 may be formed on the redistribution layer 350. The power pad 360 is exposed from the redistribution layer 350 and may be supplied with power from the outside of the device. The redistribution layer 350 may connect the third back routing wiring M3b and the power pad 360. Therefore, the first to third back routing wirings M1b, M2b, and M3b may form the power delivery network (PDN) of the semiconductor device according to some embodiments. Although not specifically shown, the redistribution layer 350 includes wiring patterns of multi-layers, and may connect the third back routing wiring M3b and the power pad 360. For example, the redistribution layer 350 may include a polymer layer, and wiring patterns of multi-layers formed inside the polymer layer.

Although only routing wirings of three layers (e.g., M1b, M2b, and M3b) are shown as being formed between the substrate 100 and the redistribution layer 350, this is only for convenience of explanation. Routing wirings of four layers of more may be formed in accordance with various embodiments of the inventive concept.

Figure 16:
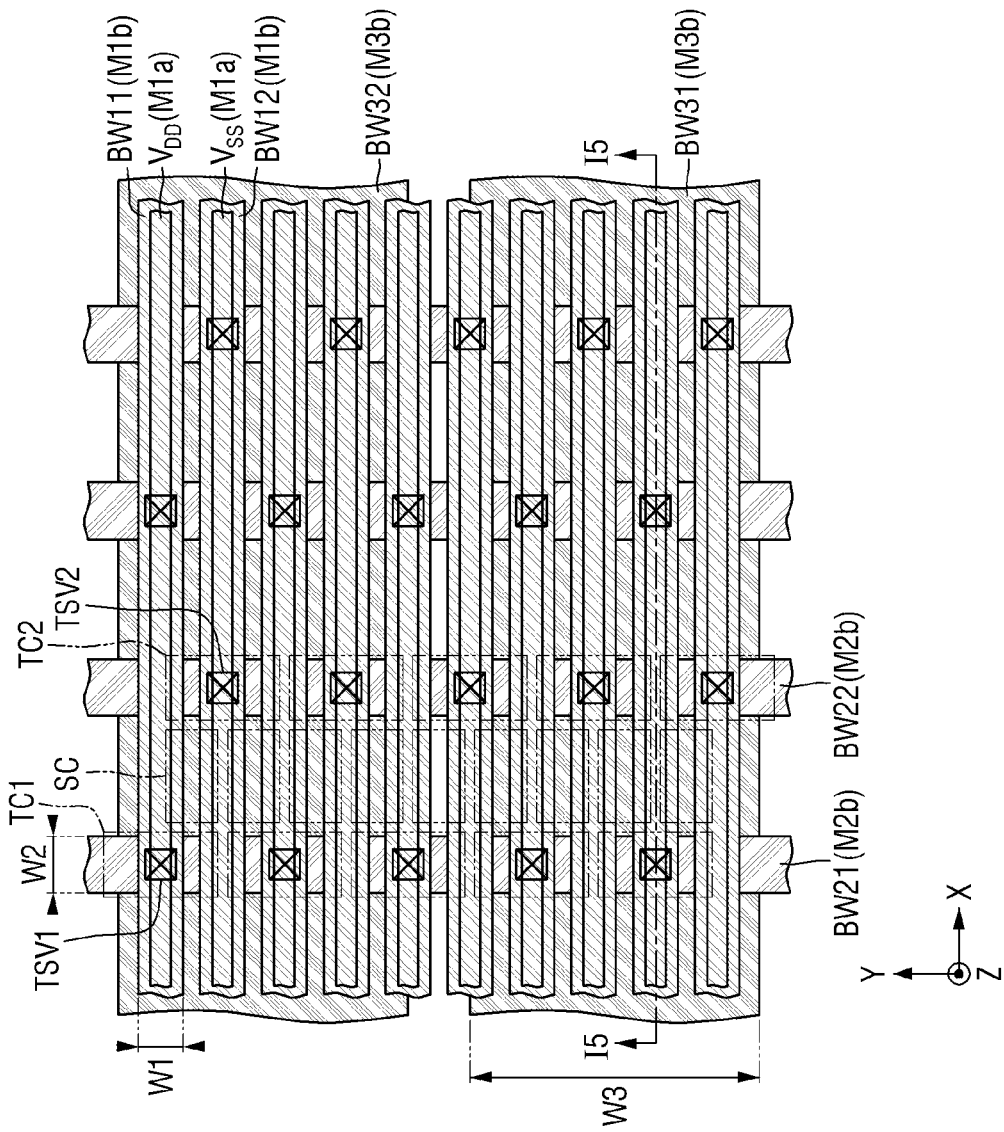
FIG. 16 is a schematic layout diagram that illustrate a semiconductor device according to some embodiments of the inventive concept.
Figure 17:
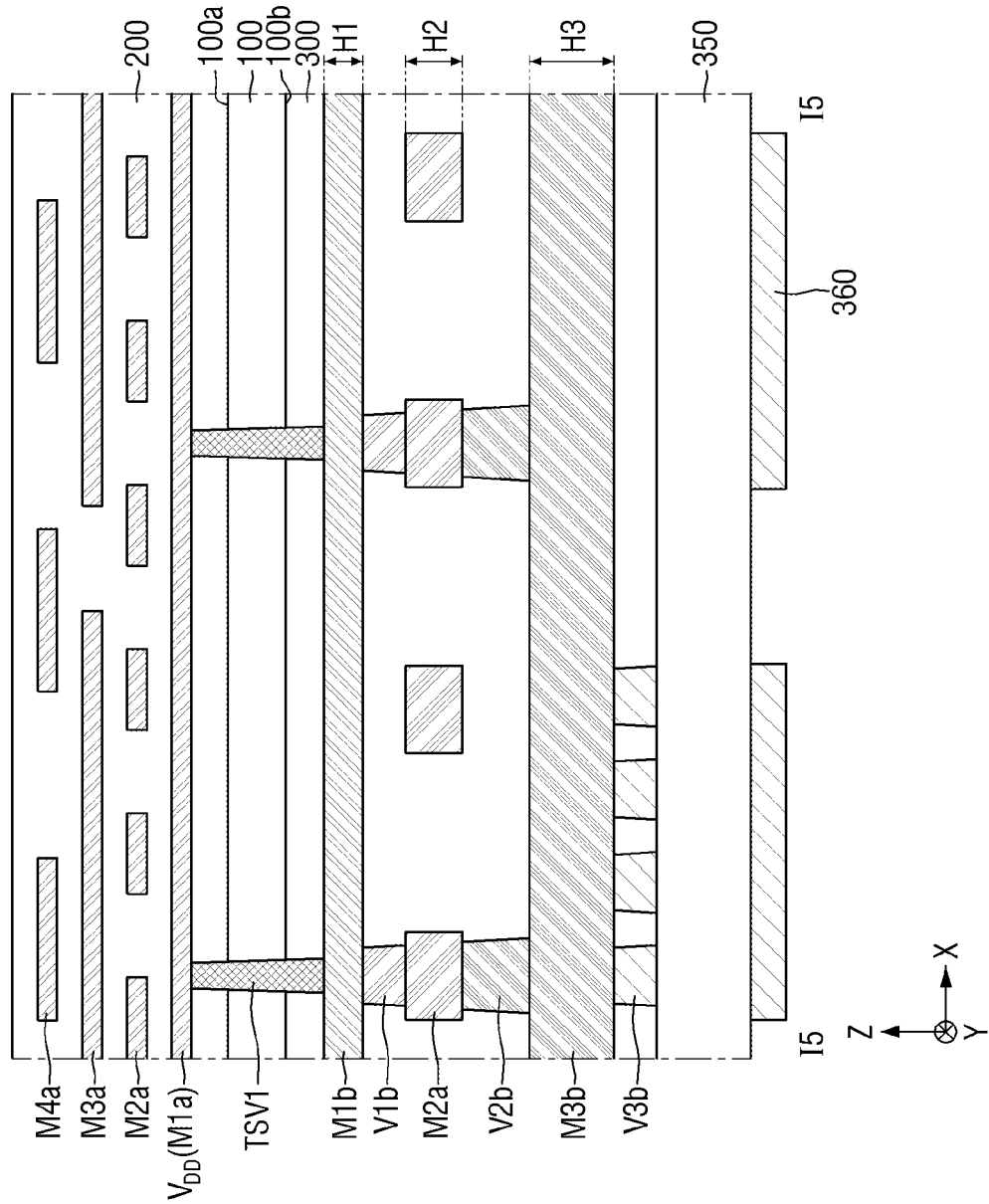
FIG. 17 is a schematic cross-sectional view taken along I5-I5 of FIG. 16.

FIG. 16 is a schematic layout diagram that illustrates a semiconductor device according to some embodiments of the inventive concept. FIG. 17 is a schematic cross-sectional view taken along I5-I5 of FIG. 16. For convenience of explanation, repeated parts of embodiments described above will be briefly described or omitted referring to FIGS. 1 to 9.

Referring to FIGS. 16 and 17, in a semiconductor device according to some embodiments, the first back routing wiring M1b extends alongside the first power wiring $V_{DD}$ and the second power wiring $V_{SS}$. For example, the first back routing wiring M1b may extend in the first direction X.

In some embodiments, the first back wiring pattern BW11 may be arranged to overlap in the z-direction the first power wiring $V_{DD}$. The first tab cell region TC1 including the first through via TSV1 may connect the first power wiring $V_{DD}$ and the first back wiring pattern BW11. As a result, the first back routing wiring M1b that forms the power delivery network (PDN) may supply the first power voltage to the standard cell region SC.

In some embodiments, the second back wiring pattern BW12 may be arranged to overlap in the Z-direction the second power wiring $V_{SS}$. The second tab cell region TC2 including the second through via TSV2 may connect the second power wiring $V_{SS}$ and the second back wiring pattern BW12. As a result, the first back routing wiring M1b that forms the power delivery network (PDN) may supply the second power voltage to the standard cell region SC.

The second back routing wiring M2b may intersect the first back routing wiring M1b. For example, the second back routing wiring M2b may extend in the second direction Y. The third back routing wiring M3b may intersect the second back routing wiring M2b. For example, the third back routing wiring M3b may extend in the first direction X. Therefore, the first to third back routing wirings M1b, M2b, and M3b may form the power delivery network (PDN) of the semiconductor device according to some embodiments.

Hereinafter, a layout design method for a semiconductor device and a method for fabricating a semiconductor device according to example embodiments will be described referring to FIGS. 18 and 19.

Figure 18:
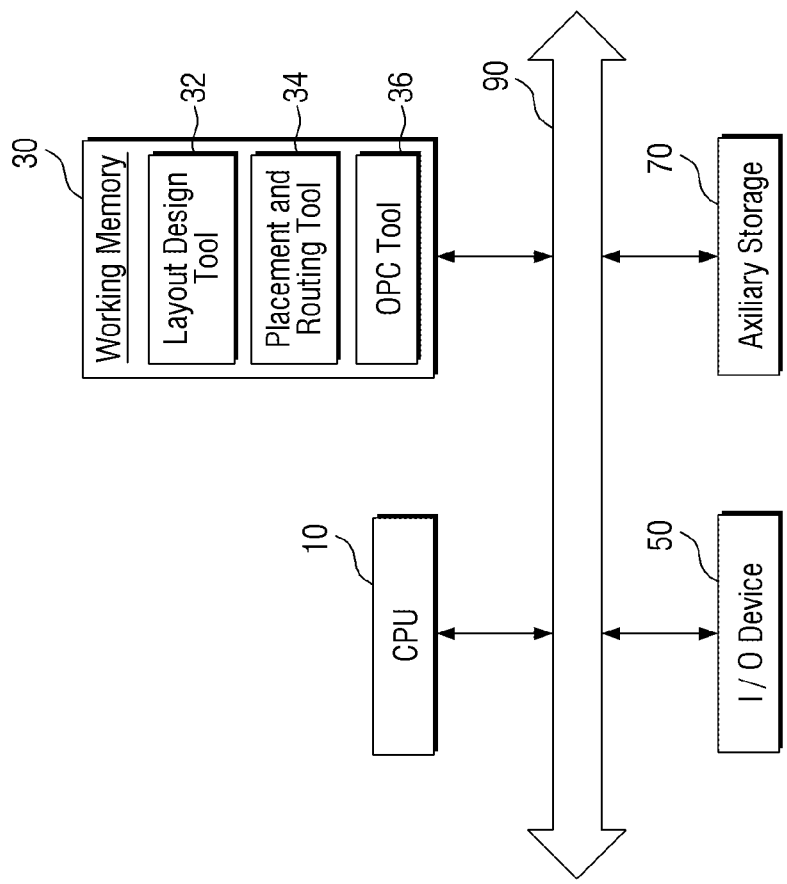
FIG. 18 is a block diagram of a computer system configured to execute the layout design of a semiconductor device according to some embodiments of the inventive concept.

FIG. 18 is a block diagram of a computer system for executing or generating the layout design of a semiconductor device according to some embodiments of the inventive concept.

Referring to FIG. 18, a computer system may include a CPU 10, a working memory 30, an I/O device 50, and an auxiliary storage 70. The computer system may be provided as a dedicated device for a layout design of the semiconductor device according to some embodiments. In some embodiments, the computer system may also include various design and verification simulation programs.

The CPU 10 may be configured to execute software (application programs, operating systems, and device drivers) that is stored in a computer readable medium on or accessible to the computer system. The CPU 10 may be configured to execute the operating system that is loaded into the working memory 30. The CPU 10 may be configured to execute application programs that are driven based on the operating system. For example, the CPU 10 may be configured to execute a layout design tool 32, a placement and routing tool 34 and/or an OPC tool 36 loaded into the working memory 30.

The aforementioned operating system or the aforementioned application programs may be loaded into the working memory 30. An operating system image (not shown) stored in the auxiliary storage 70 when booting up the computer system may be loaded into working memory 30 in accordance with a booting sequence. Various I/O operations of the computer system may be supported by the operating system.

A layout design tool 32 for the layout design of the semiconductor device according to some embodiments may be loaded from the auxiliary storage 70 into the working memory 30. Subsequently, the placement and routing tool 34, which is configured to place the designed standard cells, rearrange the internal wiring pattern in the placed standard cells, and route the placed standard cells, may be loaded from the auxiliary storage 70 into the working memory 30. Subsequently, an OPC tool 36 that is configured to perform an optical proximity correction (OPC) of the designed layout data may be loaded from the auxiliary storage 70 into the working memory 30.

The I/O device 50 may be configured to control the user's input and output from the user interface devices. For example, the I/O device 50 includes a keyboard or a monitor, and may receive input of information from the user. The user may receive input of information about semiconductor regions and data paths that require adjusted operating characteristics, using the I/O device 50. In addition, the processing process and processing results of the OPC tool 36 may be displayed through the I/O device 50.

The auxiliary storage 70 may be provided as a storage medium of a computer system. The auxiliary storage 70 may store application programs, an operating system image, and various data.

A system interconnector 90 may be a system bus for providing a network inside a computer system. The CPU 10, the working memory 30, the I/O device 50, and the auxiliary storage 70 may be electrically connected through the system interconnector 90, and data may be exchanged.

Figure 19:
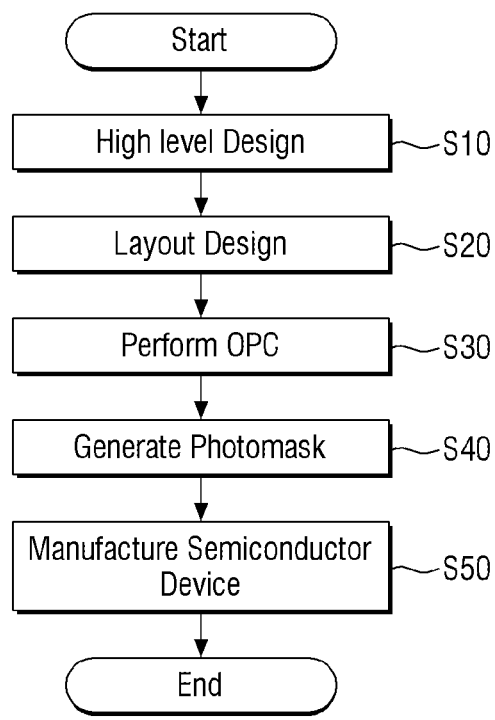
FIG. 19 is a flowchart that illustrate a layout design method for a semiconductor device, and a method for fabricating the same according to some embodiments of the inventive concept.

FIG. 19 is a flowchart that illustrates a layout design method for the semiconductor device, and a method for fabricating the same according to some embodiments of the inventive concept.

Referring to FIG. 19, a high level design of a semiconductor integrated circuit may be performed using the computer system described above using FIG. 18 (S10). The high level design may mean description of the integrated circuit to be designed in a parent computer programming language. For example, a parent language, such as C-language, may be used for high level design. Circuits designed by high level design may be expressed more specifically by register transfer level (RTL) coding or simulation. Subsequently, the code generated by the register transfer level coding is converted into a Netlist and may be synthesized by the entire semiconductor element. A synthesized schematic circuit is verified by the simulation tool, and the adjustment process may be accompanied according to the verification result.

Subsequently, a layout design for implementing the logically completed semiconductor integrated circuit on a silicon substrate may be performed (S20). For example, the layout design may be performed, by referring to the schematic circuit synthesized in the upper level design or Netlist corresponding thereto. The layout design may include routing procedures for placing and connecting various standard cells provided by the Cell Library in accordance with the defined design rules.

The layout may be a procedure for defining the form or size of a pattern for forming a transistor and metal wirings to be actually formed on the silicon substrate. For example, to actually form an inverter circuit on the silicon substrate, the layout patterns, such as PFET, NFET, P-WELL, N-WELL, gate electrode, and wiring patterns to be placed on them, may be appropriately placed.

The selected and placed standard cells may then be routed. Specifically, upper wirings (routing patterns) may be placed on the placed standard cells. By performing the routing, the placed standard cells may be interconnected according to the design.

After the routing, layout verification may be performed to determine whether there are any parts that violate the design rules. Items to be verified may include a DRC (Design Rule Check), an ERC (Electronical Rule Check), and a LVS (Layout vs Schematic).

Subsequently, an optical proximity correction (OPC) procedure may be performed (S30). The layout patterns provided through the layout design may be implemented on the silicon substrate using a photolithography process. At this time, the optical proximity correction may be a technique for correcting a distortion phenomenon that may occur in the photolithography process.

Subsequently, a photomask may be produced on the basis of the layout changed by the optical proximity correction (S40). The photomask may be produced, for example, in a manner that draws the layout patterns using a chrome film coated on a glass substrate.

Subsequently, a semiconductor element may be fabricated using the generated photomask (S50). In the process of fabricating the semiconductor element using a photomask, various types of exposure and etching processes may be repeated. The shape of the patterns formed at the time of layout design may be sequentially formed on the silicon substrate through such processes.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device including a standard cell region, the semiconductor device comprising:
    a substrate including a first surface and a second surface, which are opposite to each other;
    a first power wiring, which extends in a first direction on the first surface of the substrate, and is configured to provide a first power voltage to the standard cell region;
    a second power wiring, which extends in the first direction on the first surface of the substrate, is arranged alternately with the first power wiring in a second direction intersecting the first direction, and is configured to provide a second power voltage different from the first power voltage to the standard cell region;
    a first back routing wiring on the second surface of the substrate;
    a plurality of first tab cell regions arranged along the second direction; and a plurality of second tab cell regions, which are spaced apart from the plurality of first tab cell regions and are arranged along the second direction, wherein each of the first tab cell regions includes a first through via, which penetrates the substrate and connects the first power wiring and the first back routing wiring, and wherein each of the second tab cell regions includes a second through via, which penetrates the substrate and connects the second power wiring and the first back routing wiring.

2. The semiconductor device of claim 1, further comprising:

an active pattern extending in the first direction, inside the standard cell region;

a gate electrode extending in the second direction on the active pattern; and a source/drain contact connected to a source/drain region of the active pattern on one side of the gate electrode, wherein the first power wiring is connected to the source/drain contact.

3. The semiconductor device of claim 1, wherein the standard cell region is interposed between the plurality of first tab cell regions and the plurality of second tab cell regions.

4. The semiconductor device of claim 1, wherein the first back routing wiring includes a first back wiring pattern connected to the first through via, and a second back wiring pattern, which extends alongside the first back wiring pattern and is connected to the second through via.

5. The semiconductor device of claim 4, wherein the first back wiring pattern and the second back wiring pattern each extend in the second direction, and are arranged alternately in the first direction.

6. The semiconductor device of claim 1, further comprising:

a second back routing wiring which is spaced farther apart from the second surface of the substrate than the first back routing wiring, and intersects the first back routing wiring; and a third back routing wiring which is spaced farther apart from the second surface of the substrate than the second back routing wiring, and intersects the second back routing wiring.

7. The semiconductor device of claim 6, further comprising:

a redistribution layer connected to the third back routing wiring on the second surface of the substrate; and a power pad on the redistribution layer.

8. A semiconductor device comprising:

a substrate including a first surface and a second surface, which are opposite to each other;

a first active pattern extending in a first direction on the first surface of the substrate;

a second active pattern, which is arranged with the first active pattern along a second direction, intersecting the first direction, on the first surface of the substrate, and extends in the first direction;

a gate electrode extending in the second direction on the first active pattern;

a first source/drain contact connected to a first source/drain region of the first active pattern;

a second source/drain contact connected to a second source/drain region of the second active pattern;

a first power wiring extending in the first direction and connected to the first source/drain contact on the first surface of the substrate;

a second power wiring extending in the first direction and connected to the second source/drain contact on the first surface of the substrate;

a first back routing wiring on the second surface of the substrate;

a plurality of first through vias arranged along the second direction; and a plurality of second through vias, which are spaced apart from the plurality of first through vias and arranged along the second direction, wherein the first power wiring and the second power wiring are arranged alternately in the second direction, wherein each of the first through vias penetrates the substrate and connects the first power wiring and the first back routing wiring, and wherein each of the second through vias penetrates the substrate and connects the second power wiring and the first back routing wiring.

9. The semiconductor device of claim 8, wherein the first source/drain contact and the first through via are arranged along the first direction.

10. The semiconductor device of claim 8, further comprising:

a second through via, which penetrates the substrate and connects the second power wiring and the first back routing wiring.

11. The semiconductor device of claim 8, wherein the first active pattern includes a fin-type pattern protruding from the first surface of the substrate.

12. The semiconductor device of claim 8, wherein the first active pattern includes a plurality of wiring patterns that are sequentially stacked on the first surface of the substrate and spaced apart from each other.

13. A semiconductor device including a standard cell region, the semiconductor device comprising:

a substrate including a first surface and a second surface, which are opposite to each other;

a first power wiring, which extends in a first direction on the first surface of the substrate, and is configured to provide a first power voltage to the standard cell region;

a second power wiring, which extends alongside the first power wiring on the first surface of the substrate, and is configured to provide the standard cell region with a second power voltage different from the first power voltage;

a first back routing wiring placed at a first back routing level on the second surface of the substrate;

a second back routing wiring, which is placed at a second back routing level that is spaced apart from the second surface of the substrate farther than the first back routing level and intersects the first back routing wiring;

a plurality of first through vias arranged along a second direction intersecting the first direction; and a plurality of second through vias, which are spaced apart from the plurality of first through vias and arranged along the second direction, wherein the first power wiring and the second power wiring are arranged alternately in the second direction, wherein each of the first through vias penetrates the substrate and connects the first power wiring and the first back routing wiring; and wherein each of the second through via penetrates the substrate and connects the second power wiring and the first back routing wiring.

14. The semiconductor device of claim 13, further comprising:
- an active pattern extending in the first direction inside the standard cell region;
- a gate electrode extending in a second direction intersecting the first direction on the active pattern; and
- a source/drain contact connected to a source/drain region of the active pattern on one side of the gate electrode,
- wherein the first power wiring is connected to the source/drain contact.

15. The semiconductor device of claim 13, wherein the first back routing wiring extends in a second direction intersecting the first direction.

16. The semiconductor device of claim 13, further comprising:
- a third back routing wiring, which is placed at a third back routing level that is spaced apart from the second surface of the substrate farther than the second back routing level and intersects the second back routing wiring.

17. The semiconductor device of claim 16, further comprising:
- a redistribution layer connected to the third back routing wiring on the second surface of the substrate; and
- a power pad on the redistribution layer.

\* \* \* \* \*